United States Patent [19]
Tanimoto et al.

[11] Patent Number: 5,548,138
[45] Date of Patent: Aug. 20, 1996

[54] SEMICONDUCTOR DEVICE WITH REDUCED TUNNEL RESISTANCE AND CIRCUITRY USING THE SAME

[75] Inventors: Takuma Tanimoto, Kokubunji; Makoto Kudo, Hachiohji; Tomoyoshi Mishima, Shiki; Akishige Nakajima, Kokubunji; Mitsuhiro Mori, Moriya-machi; Masao Yamane, Takasaki, all of Japan

[73] Assignee: Hitachi, Ltd., Tokyo, Japan

[21] Appl. No.: 120,818

[22] Filed: Sep. 15, 1993

[30] Foreign Application Priority Data

Sep. 18, 1992 [JP] Japan .................................... 4-249185

[51] Int. Cl.$^6$ .................. H01L 31/0328; H01L 31/0336
[52] U.S. Cl. ............................................ 257/192; 257/194
[58] Field of Search ................................... 257/192, 194, 257/24, 20, 26, 27, 29, 280, 284

[56] References Cited

U.S. PATENT DOCUMENTS

| | | | |
|---|---|---|---|
| 4,855,895 | 8/1989 | Shigaki et al. | 363/157 |
| 4,882,609 | 11/1989 | Schubert et al. | 257/194 |
| 5,105,241 | 4/1992 | Ando | 257/194 |
| 5,151,618 | 9/1992 | Yokoyama et al. | 257/197 |
| 5,262,660 | 11/1993 | Streit et al. | 257/194 |
| 5,283,448 | 2/1994 | Bayraktaroglu | 257/194 |
| 5,313,093 | 5/1994 | Nakagawa | 257/194 |

*Primary Examiner*—Wael M. Fahmy
*Attorney, Agent, or Firm*—Antonelli, Terry, Stout & Kraus

[57] ABSTRACT

In a semiconductor device using tunnel current and a barrier layer, arrangements are provided to lower the resistance of the semiconductor device. In particular, arrangements are provided to lower the parasitic resistance of a device such as a field effect transistor or an HBT, as well as to provide high-performance low noise amplifiers, mixers and the like using such reduced resistance semiconductor devices. To achieve this reduced resistance, carrier concentration or effective mass is designed not to be uniform in at least one of the semiconductor layers holding a barrier layer therebetween. For example, in an area near the barrier layer, the carrier concentration distribution can be large or the effective mass distribution can be small.

34 Claims, 27 Drawing Sheets low ⟷ high
ionized impurity density

SEMICONDUCTOR DEVICE WITH REDUCED TUNNEL RESISTANCE AND CIRCUITRY USING THE SAME

BACKGROUND OF THE INVENTION

The present invention relates to a semiconductor device constructed so that a tunnel current flows between semiconductor layers with a barrier layer held therebetween. It also relates to a low noise amplifier circuit, a mixer, a logic circuit and a memory circuit which use such a semiconductor device as a field effect transistor or a heterobipolar transistor.

Field effect transistors in which a tunnel current flows through the source-drain electrode region are well known as semiconductor devices for causing the tunnel current to flow. Japanese Patent Laid-Open No. 60570/1988, for example, proposes an HEMT (High Electron Mobility Transistor) constructed from GaAs as a channel material. Further, Japanese Patent Laid-Open No. 3467/1986 proposes an InGaAs channel HEMT. Moreover, high power HEMT has been referred to in the Technical Research Report ED91–151 (1991), pp 95–99, the Electronic Information Communication Society of Japan. However, no measure to decrease the tunnel current has been taken in any one of the references mentioned above.

As an example of taking steps to decrease the tunnel current, an FET with reduced tunnel resistance between metal in the source-drain electrode region and a semiconductor has been referred to in Japanese Journal of Applied Physics, 25 (1986), pp L865–L867. However, no consideration has been given in that reference to the tunnel resistance between semiconductor layers with a barrier layer held therebetween, unlike the present invention.

As another example of taking into consideration the tunnel resistance between semiconductor layers with a barrier layer held therebetween in the field of art to which the present invention pertains, an HEMT with reduced tunnel resistance between semiconductor layers with a barrier layer held therebetween has been referred to in the Technical Research Report ED90–141 (1990), pp 57–63, the Electronic Information Communication Society of Japan. FIG. 2 illustrates this example. As shown in FIG. 2, an undoped InAlAs buffer layer 23, an undoped InGaAs channel layer 24, an undoped InAlAs spacer layer 25, an n-InAlAs carrier supply layer 26 and an undoped InAlAs barrier layer 27 are successively stacked on a semi-insulating InP substrate 22 in the above order. Further, an n-InAlAs resistance reduction layer 28 and an n-InGaAs cap layer 29 are successively piled up on the undoped InAlAs barrier layer 27 in the source drain electrode region. Moreover, a source and a drain electrode are formed on the n-InGaAs cap layer 29, whereas a gate electrode is formed on the undoped InAlAs barrier layer 27. In this case, the n-InAlAs resistance reduction layer 28 held between the n-InGaAs cap layer 29 and the undoped InAlAs barrier layer 27 is used to lower the tunnel resistance.

Source resistance is one of the important performance indexes of an FET. The source resistance is directly related to the gain of the FET and this makes it an important subject to lower the source resistance in order to improve not only RF (Radio frequency) performance but also noise characteristics. In the case of a heterojunction FET, an ohmic contact including tunneling between semiconductor layers via a barrier is employed as in the prior art. A barrier like this is a layer formed to secure gate breakdown voltage, and tunneling via the barrier layer is certainly not neglible in the case of such a heterojunction element partly because successive crystalline growth is ensured and partly because the process of making the element is facilitated. With respect to the tunneling via the barrier, the resistance may be lowered by reducing the barrier height. On the other hand, the barrier has to be kept high enough to secure the source to gate breakdown voltage and to hold the carrier concentration in the channel at a higher level. In other words, it has not been practicably possible to reduce the barrier height beyond a certain point. As a result, importance is attached to decreasing the resistance involved in tunneling as a decisive factor in order to lower the source resistance essential to upgrading the performance of an FET.

With respect to an HBT or a RHET, the emitter and base resistance should be lowered to improve their performance. In order to improve the intrinsic performance of these devices in particular, the base layer has been made more shallow; however, a problem arising from this is that the thinner the base layer is made, the greater the input resistance (base resistance) becomes. Another problem also arises from the fact that the base electrode and the intrinsic HBT area are difficult to join together.

In the case of high power FETs, since the current density in the operating area of a high power FET tends to increase, not only the magnitude of the source resistance but also the ohmic contact poses a problem on a heterojunction FET in particular. For this reason, it has been essential to lower the source resistance and to improve the ohmic contact even in the aforementioned prior art heterojunction FET.

When an FET is applied to a low noise amplifier circuit, for example, the higher the operating frequency becomes, the lower the gain remains. In order to prevent the gain from decreasing, it is common to reduce the negative feedback capacitance (gate-to-drain capacitance) by making the gate width shorter to secure the gain. However, the source resistance increases as the gate width is shortened, thus increasing the noise figure. As a result, satisfactory performance of such a low noise amplifier circuit has not yet been achieved. When, moreover, an FET is used for extra high-speed use, the current gain cutoff frequency and the power gain cutoff frequency should be improved, and this makes it an important subject to lower the source resistance. In addition, the application of similar circuits to HBT and RHET also makes it a critical subject to lower the base resistance.

Nevertheless, the results of attempts at decreasing the tunnel resistance have thus far been insufficient as far as the prior art introduced in the Technical Research Report ED90–141 (1990), pp 57–63, the Electronic Information Communication Society of Japan is concerned.

SUMMARY OF THE INVENTION

A first object of the present invention is to provide a semiconductor device with small tunnel resistance between semiconductor layers via a barrier layer held therebetween.

A second object of the present invention is to provide a high-performance low noise amplifier and a mixer, a logic circuit and a memory circuit which are capable of operating at high speed.

The aforesaid first object can be accomplished by a first means having an area in which carrier density distribution in the direction of thickness of at least one of two semiconductor layers holding the barrier layer therebetween is great in the vicinity of the barrier layer and decreases therefrom.

Moreover, the first object can be accomplished by a second means having an area in which the effective mass distribution of the carrier in the direction of thickness of at least one of two semiconductor layers holding the barrier layer therebetween is small and increases therefrom. Further, the first object can be accomplished by a third means for making the barrier layer under the ohmic contact portion thinner than the barrier layer in areas other than under the ohmic contact portion.

The second object can be accomplished by employing such an FET to construct circuits such as a low noise amplifier, a mixer, a logic circuit and a memory circuit.

In the present invention, the inventors have taken into account that the tunnel resistance via the barrier is inversely proportional to the product of a density of state in the initial and final states and tunneling probability. Therefore, it is important to increase the density of state in the initial and final states, and the tunneling probability so as to lower the tunnel resistance. The density of state is increased by the first means. As shown in FIGS. 1 and 3, in accordance with the present invention, the aforesaid density of state can be increased by increasing the carrier density in the vicinity of the barrier since only the carrier in the vicinity of the barrier distributes to tunneling in the real space.

FIG. 1 shows a sharp transition point of carrier density at a depth of about 20 nm from the barrier layer. Of course, this is solely for purposes of example since the depth of such a point of transition, and the shape of the carrier density curve, for that matter, can be changed depending on the requirements of a particular device.

In the embodiment of FIG. 3, the semiconductor layer and the barrier layer are prepared from the same material similar to the arrangement in the prior art described in the Technical Research Report ED90–141 (1990), pp. 57–63, of the Electronic Information Communication Society of Japan. However, in the prior art, the carrier density distribution, unlike what is the case with the present invention, has not been made great in the vicinity of the barrier and remains uniform in the direction of thickness of the barrier. Consequently, the number of carriers contributing to tunneling is smaller than that of those according to the present invention.

In the structure of the first means, ionized impurity concentration in the semiconductor layer is variable as shown in FIG. 4, for instance, and the first means is obtainable from such a structure that the concentration distribution is great in the vicinity of the barrier and made smaller in the receding direction therefrom. To form the ionized impurity Si distribution in the first GaAs semiconductor layer 1, an MBE (molecular beam epitaxy) system can be used with two Si cells (cell A and cell B). During growth of the highest ionized impurity density layer of the first semiconductor layer adjacent to the barrier layer, the temperature in cell A is controlled to be 1175° C., which achieves Si concentration in the GaAs layer as $7 \times 10^{18} (cm^{-3})$, and cell B is controlled to be 1160° C., which achieves Si concentration in the GaAs layer as $5 \times 10^{18} (cm^{-3})$. To do this, first, the shutter of cell A is opened, and that of cell B is kept closed. After growth of highest ionized layer growth, the shutter of cell A is closed and the shutter of cell B is opened. During the growth of second highest ionized impurity concentration layer, the temperature of cell A is changed from 1175° C. to 1140° C., which achieves Si concentration in the GaAs layer as $3 \times 10^{18} (cm^{-3})$. After growth of the second highest ionized impurity concentration layer growth for the first semiconductor layer 1, the shutter of cell B is closed and the shutter of cell A is open. In this way, a step-like ionized impurity density distribution as shown in FIG. 4 can be achieved.

When carriers are electrons, as another example shown in FIG. 5, the aforesaid structure is made available by arranging a material having greater electron affinity on the barrier layer side. This is shown in FIG. 5 by a third semiconductor layer of high electron affinity being interposed between the barrier layer and the first semiconductor layer (which has a lower electron affinity than the third semiconductor layer but a higher electron affinity than the barrier layer). When carriers are positive holes, a material should be arranged on the barrier side whose sum of electron affinity and a band gap is small. In either case, the difference between the electron affinity and the sum of the electron affinity and the band gap triggers a stabilizing phenomenon when electrons or positive holes are positioned on the barrier layer side.

Carrier depletion may occur in part of the area when the electron affinity becomes discontinuous. This can be avoided by such a structure that the electron affinity with electrons as carriers or the sum of the electron affinity and the band gap with positive holes varies or varies continuously because of a sufficiently thin stepped semiconductor layer and is thus joined to the base semiconductor layer. In this case, the aforementioned depletion will not occur, thus improving the ohmic characteristics in a portion other than what is in the vicinity of the barrier layer.

FIGS. 6 though 9 show the results of computer simulated calculations in consideration of the HEMT device. FIG. 6 shows a comparison of calculated results of conduction band energy reflecting the structures both in the present invention and the prior art. FIG. 7 shows a comparison of logarithmic values of electron densities. Based on an arrangement of the present invention as shown in FIG. 5, a semiconductor layer 3 was made an InGaAs layer having a thickness of L=5 nm, a barrier layer an n-type AlGaAs layer, and a channel layer 2 an InGaAs layer. On the other hand, one of the prior art examples was so structured that it excluded the semiconductor layer 3 (conventional example 1) and another was so structured as described in the Technical Research Report ED90–141 (1990), pp. 57–63, of the Electronic Information Communication Society of Japan (conventional example 2). According to the present invention, it is obvious that the band structure of FIG. 5 has actually been formed and that the electron density of the semiconductor layer 3 is seen to have increased, the increased amount being greater than those in the conventional examples. When the increased amount is compared with that in the conventional example 2, the electron density is seen to become greater by more than one digit. This suggests that the resistance involved in tunneling in the conventional example has not lowered appreciably.

FIGS. 8 and 9 refer to an example where the thickness of the semiconductor layer 3 according to the present invention has been varied, wherein L=160 μm corresponds to a case where the thickness of the semiconductor layer 1 has been reduced to 0. As is obvious from these results, the electron density in the layer decreases as the thickness of the semiconductor layer 3 increases; consequently, the effect thus expected tends to droop. In other words, the thickness of the semiconductor layer 3 is restricted.

FIG. 10 shows the energy dependency of the density of state (local density of state) of the conduction band in the vicinity of the barrier layer in the semiconductor layers 3, 1. Although a curve 305 conforms to the density of state when the semiconductor layer 3 is sufficiently thinner than the semiconductor layer 1, curves 304, 303, 302, 301 in order only indicate the density of state in the vicinity of the barrier layer. More specifically, 301 is a local density of state in an InGaAs layer, 302 is a local density of state in a barrier layer (0<x<3L), 303 is a local density of state in a barrier layer (0<x<2L), 304 is a local density of state in a barrier layer (0<x<4L), 305 is a local density of state in a barrier layer (0<x<∞). In this manner, the local density of state increases in the vicinity of the barrier layer, and this is related to the increase of the tunnel current and thus to the lowering of the tunnel resistance.

When a material whose lattice constant is different from that in another semiconductor layer is employed as the material having a different electron affinity, the thickness should preferably be set to the extent that the crystal is not transpositioned. The reason for this is that the introduction of dislocation allows the semiconductor layer to be scraped along there against water, etching liquid or the like, thus causing the resistance to increase accordingly.

In the application of the normal heterojunction element, GaAs as a material is fit for a semiconductor layer having the aforesaid carrier density distribution in such a system as to implement lattice matching or lattice mismatching on a GaAs substrate with the AlGaAs barrier layer. With respect to a semiconductor layer having high electron affinity, InGaAs, GaAsSb, InGaAsSb are suitable for the purpose. In the system for implementing the lattice matching or lattice mismatching on an InP substrate, an InAlAs or AlGaAsSb barrier layer and an InGaAs semiconductor layer having the aforesaid carrier density distribution are suitable, whereas an InGaAs or InGaAsSb semiconductor layer having high electron affinity is suitable. Similarly, Ge or the like may be combined suitably with an InP, SiGe barrier layer instead of an InGaP barrier layer. Moreover, only a semiconductor layer having relatively high electron affinity should be arranged on the barrier layer side to have electron affinity distribution sustained. For example, InGaAs, GaAsSb, InGaAsSb, InP, InGaP, Ge semiconductor layers can be arranged on the barrier layer side and GaAs, InGaAs, InP, SiGe semiconductor layers can be arranged on the side far from the barrier layer. If these two layers are made of the same component element in this case, the electron affinity distribution may be brought about by varying the composition of the component element. If the component element includes In, Sb or Ge, a semiconductor layer having relatively high electron affinity on the barrier layer side may be formed by increasing the composition of such an element.

The aforesaid tunneling probability is increased by the second means. When the tunneling probability is increased, the carrier seeping into the barrier layer should preferably be large in amount and the seeping amount has been known to increase as the effective mass of the carrier decreases. If, therefore, a material having small effective mass exists near the barrier, the tunneling probability will increase and the tunnel resistance will lower.

The same logic as in the case of the aforesaid carrier density distribution is also established in this case, and only the carrier having small effective mass in the vicinity of the barrier contributes to tunnelling. Consequently, the effective mass distribution in the second means can be obtained by arranging a material having the effective mass of the carrier in the vicinity of the barrier. Moreover, the ohmic characteristics in a portion other than what is in the vicinity of barrier layer are improved as the effective mass distribution continuously varies.

Although the material for use at this time is the same as what is employed in the case of electron affinity above, the InGaAs layer with electrons as carriers or the GaAsSb layer with positive holes may effectively be used to allow the condition of the electron affinity or the sum of the electron affinity and the band gap to emphasize each other and to make MBE crystals and the like readily grow in the form of a GaAs substrate by means of an apparatus for growing such crystals in the case of tunneling over GaAs or InGaAs—GaAs with respect to the AlGaAs barrier in particular.

When InGaAs is used as the semiconductor layer 3, the segregation of In atoms over the surface while crystals are growing poses a problem and therefore the surface may become rough during the process of removing the GaAs layer on the surface. In order to prevent this from occurring, it is only needed to grow the AlGaAs layer on the InGaAs layer. As the InGaAs layer functions as not only what checks the surface diffusion but also an etching stopper of the GaAs layer on the surface, the surface is cleaned. However, the AlGaAs layer should be made as thin as possible in consideration of selectivity between GaAs and AlGaAs because the effect of decreasing the resistance is lowered as the layer becomes thicker; the thickness should normally be not greater than 5 nm.

The tunnel probability is also increased by the third means. Since the carrier is allowed to readily seep into the barrier as the barrier is made as thin as possible, the tunneling probability increases. A description will be given by taking FET as an example. When this structure is applied to an ohmic electrode, the height of the barrier is hardly reducible as the gate breakdown voltage has to be secured as stated above. Consequently, it is effective to make the barrier in the region under the ohmic electrode thinner than what is under the gate so as to lower the resistance. The side contact method based on so-called selective growth is ideal in view of tunneling probability. This method comprises the steps of taking the barrier off up to the lower side of the channel, causing the low resistance layer to grow again, and joining the selective growth layer directly with the channel without interposing the barrier therebetween (see IEDM 89 (1989) p. 405). However, the regrowth surface is not generally clean in the case of selective growth is compared with the continuous growth. For this reason, the contact resistance per area unit between the channel and the contact face becomes increased. With a small contact area like the side contact, the increase of the contact resistance has resulted in a new problem which is likely to arise. However, with the present invention, even though contact resistance per area unit is great, the regrowth surface exits in a wide range under the electrode in the structure of the semiconductor layer formed for the ohmic purpose with part of the barrier layer left intact. Accordingly, the whole contact resistance will not increase so much. In combination with the effect of decreasing the tunnel resistance due to a decrease in the thickness of the barrier layer, the source resistance also becomes lowered.

A similar effect can, needless to say, be achieved in preparation of the structure according to the present invention by providing an opening in the gate electrode after continuously growing the ohmic area and then selectively growing the barrier layer in the gate electrode portion.

Moreover, the effect of decreasing the tunnel resistance becomes conspicuous when the regrowth layer for the ohmic purpose has the carrier concentration distribution and the effect mass distribution.

With the structure according to the present invention, source or base resistance about half the level in the prior art can be attained, so that low noise, high gain and high speed

DETAILED DESCRIPTION

Referring to the accompanying drawings, a detailed description will be given of an embodiment of the present invention. With reference to materials to be described below, AlGaAs refers to material that substitutes Al for part of an atom Ga in GaAs (e.g., $Al_xGa_{1-x}As$), InGaAs to material that substitutes In for part of an atom Ga in GaAs (e.g., $In_xGa_{1-x}As$), InAlAs to material that substitutes In for part of an atom Al in AlAs (e.g., $In_xAl_{1-x}As$), and GaAsSb to material that substitutes an atom Sb for part of an atom As in GaAs (e.g., $GaAs_{1-x}As$).

EXAMPLE 1

Figure 5:
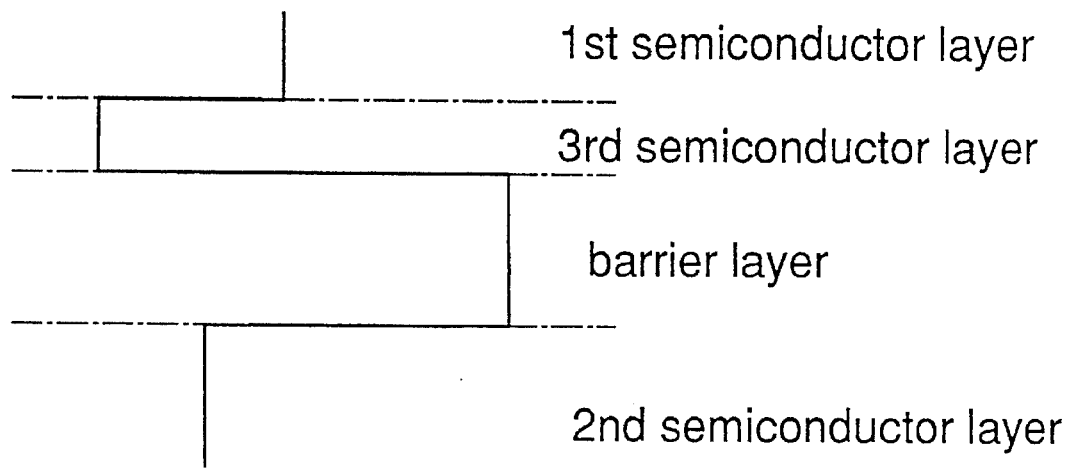
FIG. 5 is a band diagram illustrating the principle of the present invention.
Figure 6:
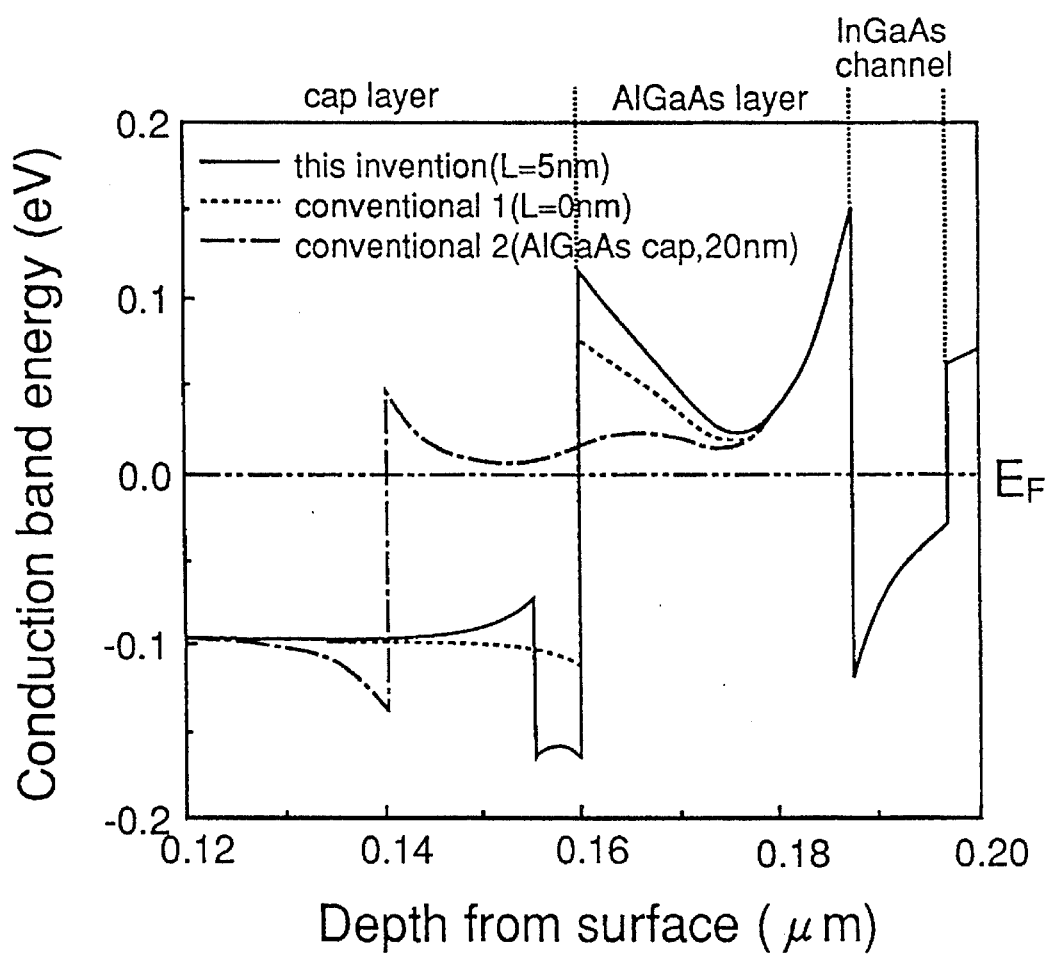
FIG. 6 is a band diagram comparing conventional examples and the present invention.
Figure 11:
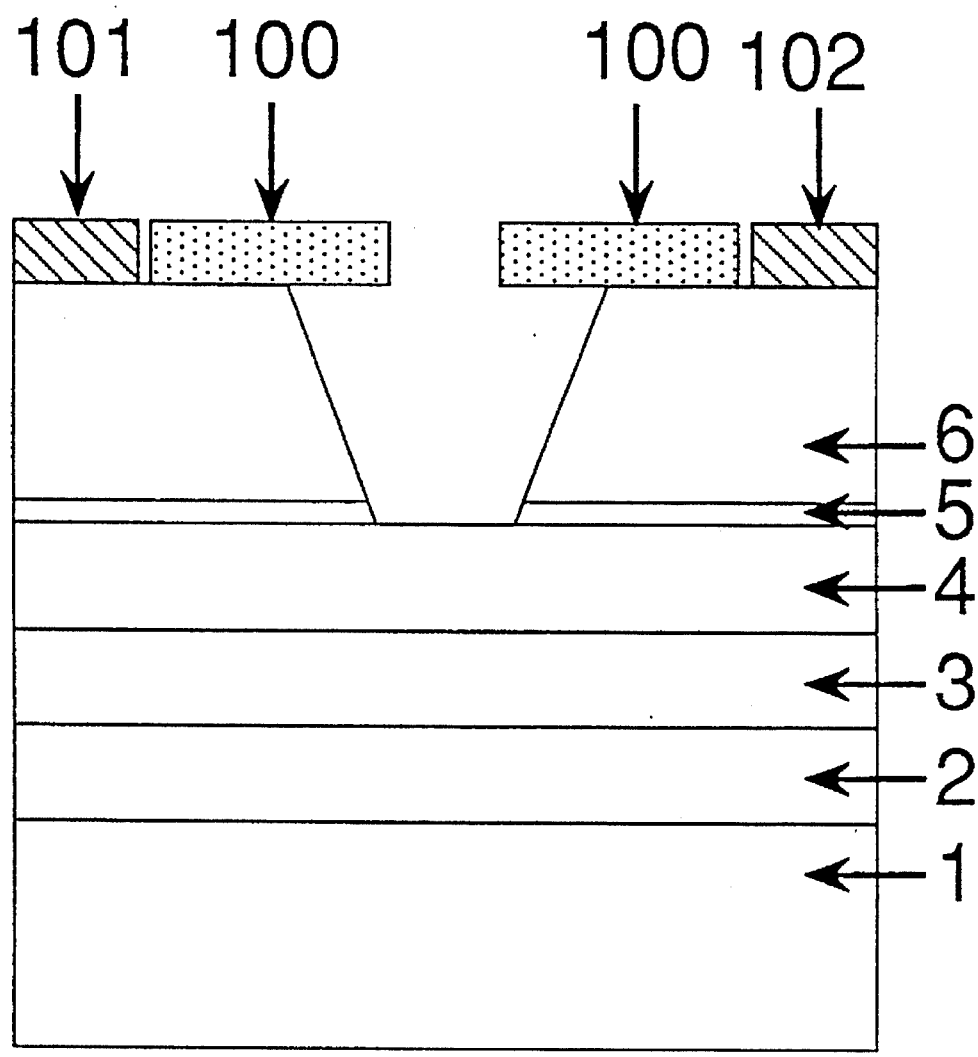
FIG. 11 is a sectional view of a first semiconductor device embodying the present invention.

FIG. 11 is a sectional view of a first example of the present invention which uses the principle shown in FIG. 5. First, an undoped GaAs layer 2 (500 nm thick), an n-GaAs channel layer 3 (thickness:10 nm, Si concentration: $3\times10^{18}/cm^3$), an undoped AlGaAs barrier layer 4 (Al composition: 0.3, thickness: 20 nm), an n-InGaAs layer 5 (In composition: 0.2, thickness: 10 nm, Si concentration: $3\times10^{18}/cm^3$), and an n-GaAs cap layer 6 (thickness: 50 nm, Si concentration: $3\times10^{18}/cm^3$) were successively stacked by MBE (Molecular Beam Epitaxy) on a semi-insulating GaAs substrate 1 in the above order. The layer 5 made of n-type InGaAs has a higher electron affinity (for example, about 1.2 electron volt, depending on the concentration of In) than the n-type GaAs layer 6 (having an electron affinity of 1.0 electron volt). Therefore, the layer 5 corresponds to the third semiconductor layer 3 of FIG. 5, while the layer 6 corresponds to the first semiconductor layer 1.

Subsequently, element-to-element isolation was carried out by cutting down the undoped GaAs layer 2 up to its mid-part by mesa etching and then a cathode electrode 101 and an anode electrode 102 were formed by lift-off. AuGe/Mo/Au was used as a cathode and anode electrode material, which was evaporated before being alloyed (at 400° C. for 5 min) in an N2 atmosphere. A lift-off mask prepared by making an opening in an SiO2 film 100 through the ordinary photolithographic process was used. Moreover, the opening in the SiO2 film 100 was side-etched by wet etching so as to give it a form to be ready for lift-off. Further, the photolithographic process was used to make the opening in a desired part of the SiO2 film 100 between the two electrodes. The cathode and anode electrodes were then separated sufficiently so as to conceal the effect resulting from alloying, both being fixedly set apart by 2 μm from the opening. When the electrodes were separated from the opening by more than 1.5 μm, the result was seen not to vary appreciably. Afterwards, the n-GaAs cap layer 6 and the n-InGaAs layer 5 under the opening portion was removed by dry and wet etching under efficient control with the SiO2 film 100 as a mask. Incidentally, the dimension of the opening was continuously varied from 1 to 150 μm. The structure of FET shown in FIG. 11 was thus acquired.

Figure 12:
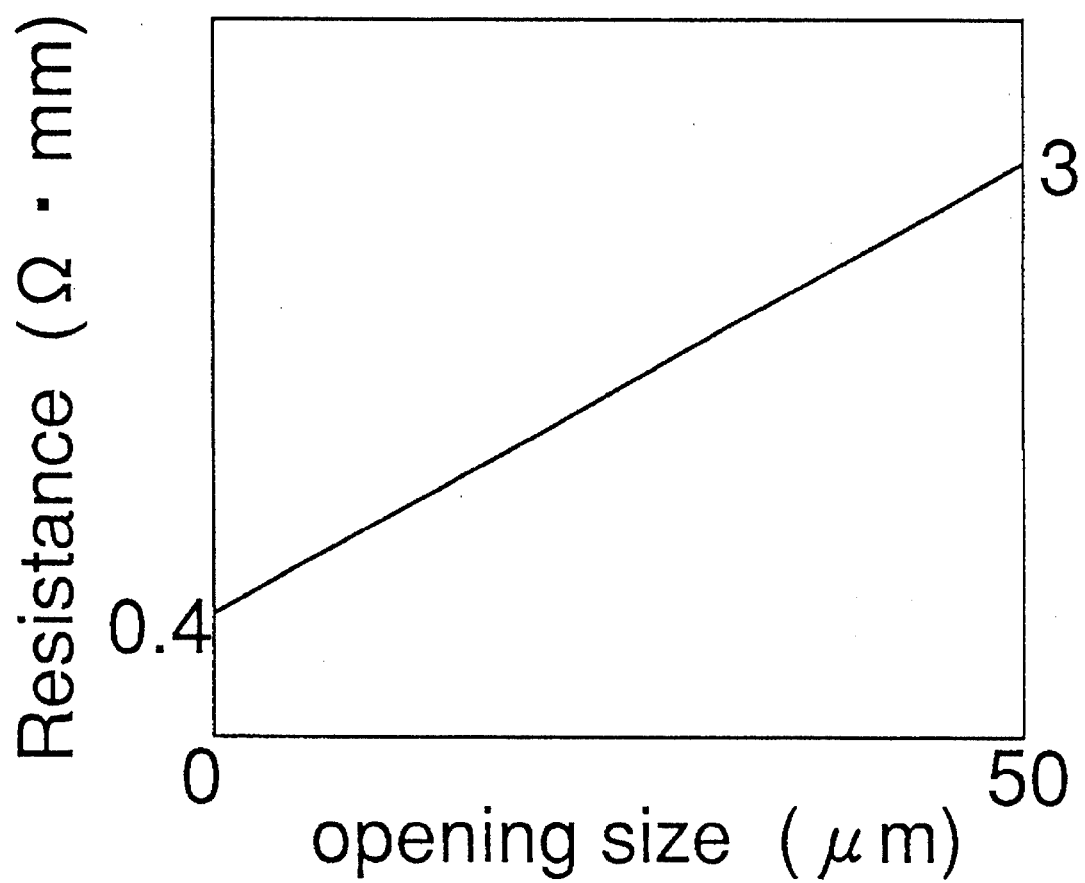
FIG. 12 is a diagram indicating the relation between resistance and spacing width of the semiconductor device of FIG. 11.
Figure 13:
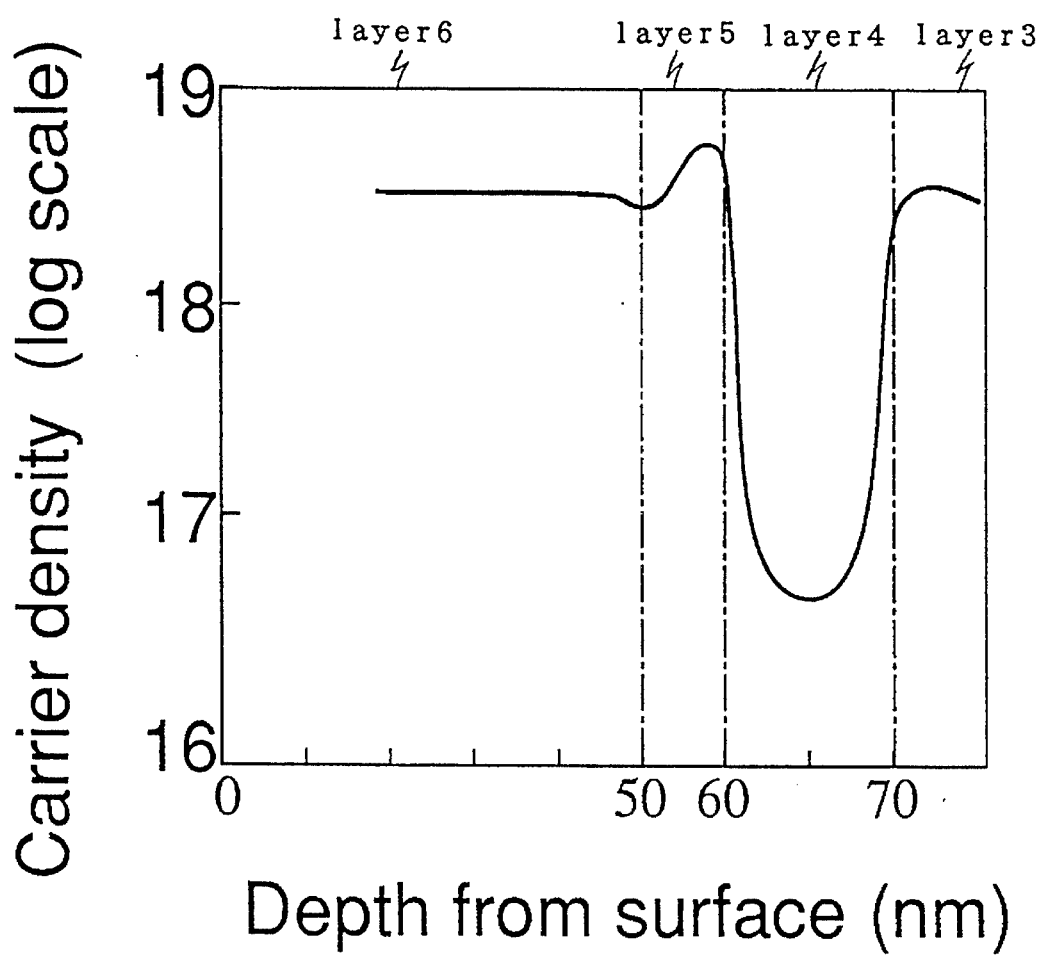
FIG. 13 shows a carrier profile measured by CV method with reference of the semiconductor device of FIG. 11.

FIG. 12 shows resistance varying with the dimension of the opening. The contact resistance can be obtained by halving the value at a point intercepting this straight resistance line. The value in this example of the invention was 0.20 Ω·mm. Similarly, the contact resistance of the semiconductor device made without only the n-InGaAs layer 5 was 0.42 Ω·mm and a high performance of about ½ was achieved in comparison. FIG. 13 shows an electronic profile in the direction of depth under the C-V method in this example, wherein the electron concentration on the side of the barrier layer 4 of the semiconductor layers 5, 6 is seen to remain higher than that in the remaining portion. The increased carrier density of the layer 5 results from its higher electron affinity, as discussed earlier with regard to FIG. 11.

Figure 14:
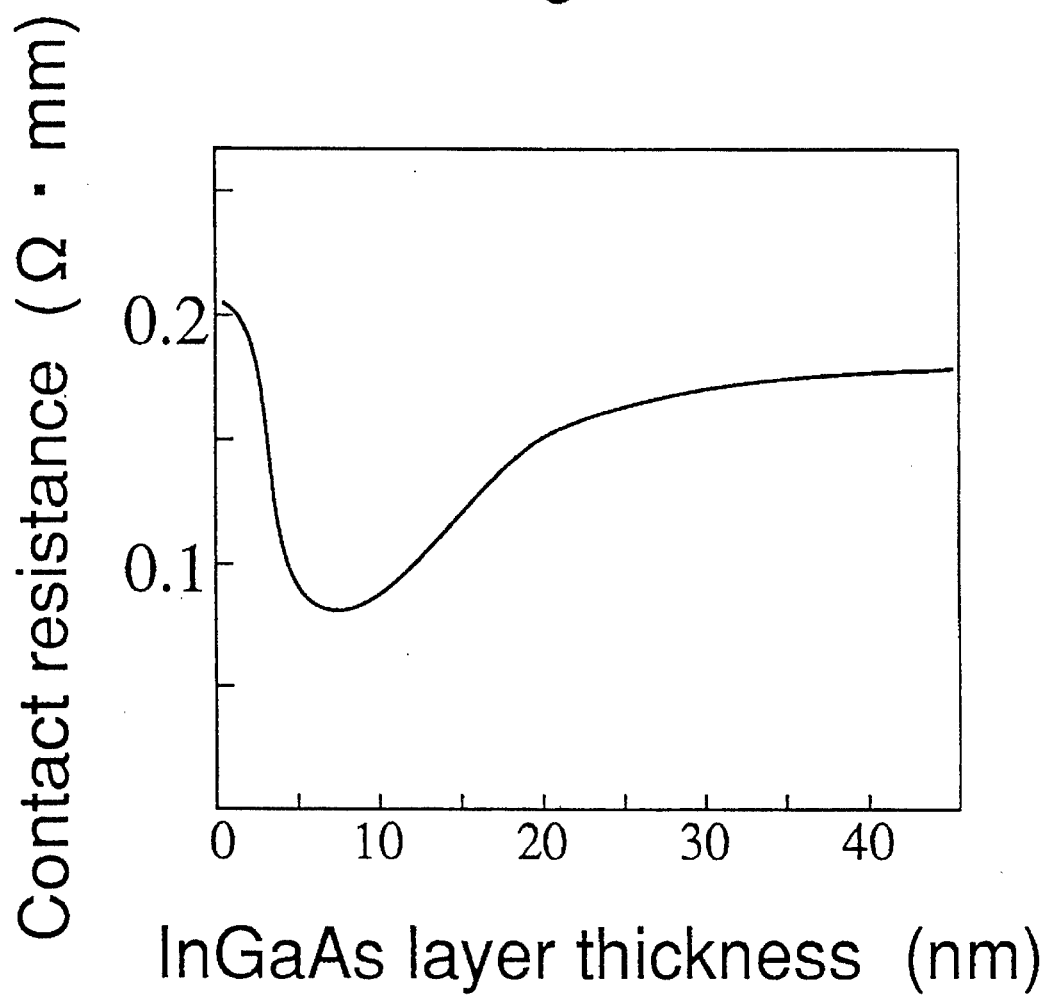
FIG. 14 is a diagram showing the relation between a semiconductor layer 5 and the contact resistance of the semiconductor device of FIG. 11.

While the In composition of the n-InGaAs layer 5 was fixed to 0.1, its thickness was varied to study the range in which electrons distributing to tunneling existed from the barrier. In order to make the other conditions constant at that time, the sum of the thicknesses of the semiconductor layers 5, 6 was also set constant. FIG. 14 shows contact resistance with respect to the thickness of the semiconductor layer 5. As is obvious from FIG. 14, the contact resistance is seen to scarcely vary in the area where the n-InGaAs layer 5 is not less than 20 nm thick. On the other hand, the semiconductor layer 5 should be as thin as possible in view of controllability when the semiconductor layers 5, 6 are removed by etching. When the semiconductor layer 5 is employed in an area where the contact resistance is relatively low and where the variation with respect to its thickness is as small as 5~15 nm, an excellent reproducibility effect is confirmable. The optimum value of the thickness is applicable to the materials for use in this example and may, needless to say, vary with the semiconductor material and the kind of the carrier. In other words, the thickness is reduced from the standpoint of variable contact resistance when the effective mass of the carrier is great as in the case of positive holes.

Although the In composition of the semiconductor layer 5 in this example was invariable, the effect of the invention will become conspicuous if there is employed such a structure that an InGaAs layer different in the In composition and as thin as several~several ten nm varies in a steplike manner or in which the In composition continuously varies and is great on the side of the barrier layer 4.

Although the ionized impurity concentrations in the n-InGaAs layer 5 and the n-GaAs cap layer 6 were set identical in this example, the concentration may be higher in either layer. If the concentration is low in the n-InGaAs layer 5 in this case, for instance, the advantage is that no interruption is required during the course of growth, and if it is high in the n-InGaAs layer 5, the advantage is that the contact resistance is lowered.

In a case where the substrate material of GaAs or the like undergoes lattice matching like this example, the effect of the invention is enhanced when the thickness of the InGaAs layer 4 is so controlled as to admit no dislocation into the crystal, that is, to make the layer a distortion layer. In other words, the sheet resistivity of the channel 3 increases when the composition is what admits dislocation into the lattice. In an element using such a semiconductor device as an FET and HBT, the deterioration of other characteristics due to dislocation is offset by the lowered contact resistance.

Although electrons were employed as the carriers in this example, positive holes may be used as well to achieve similar effect and p-type ionized impurities may be used in each semiconductor layer at this time.

EXAMPLE 2

Figure 1:
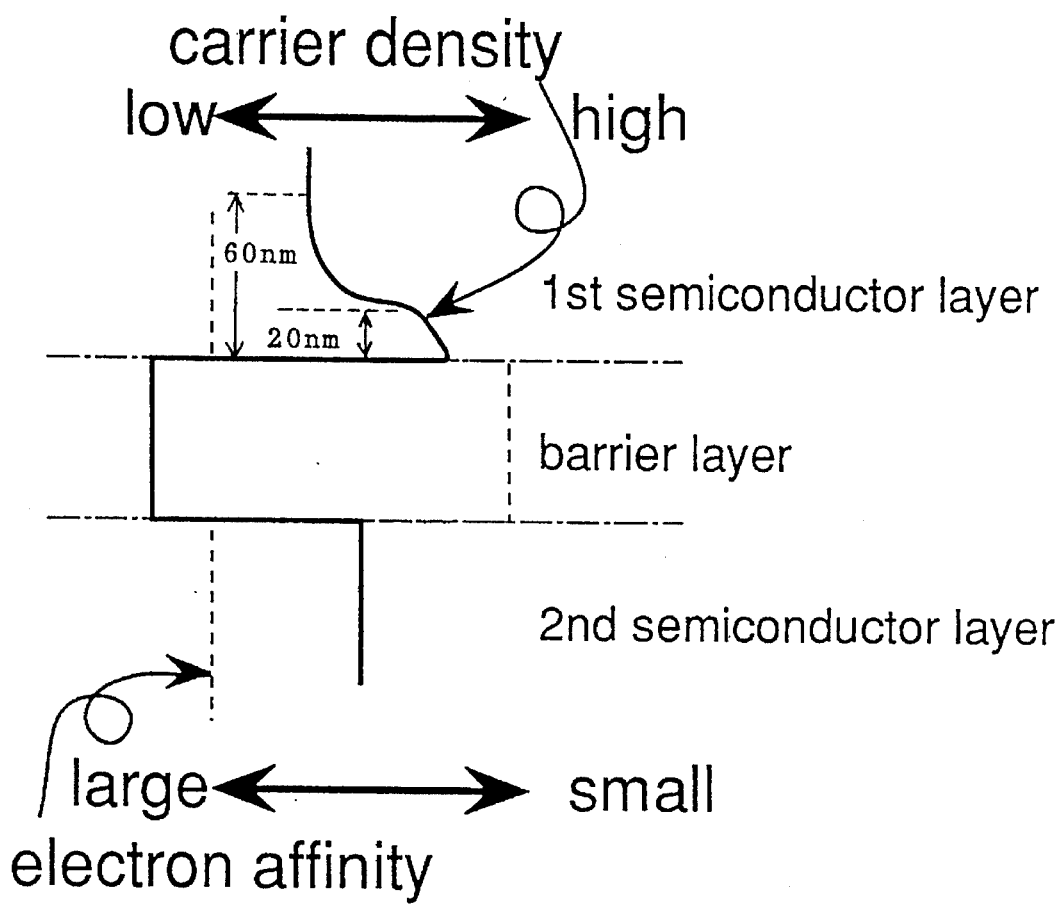
FIG. 1 is a carrier distribution diagram illustrating a principal of the present invention.
Figure 2:
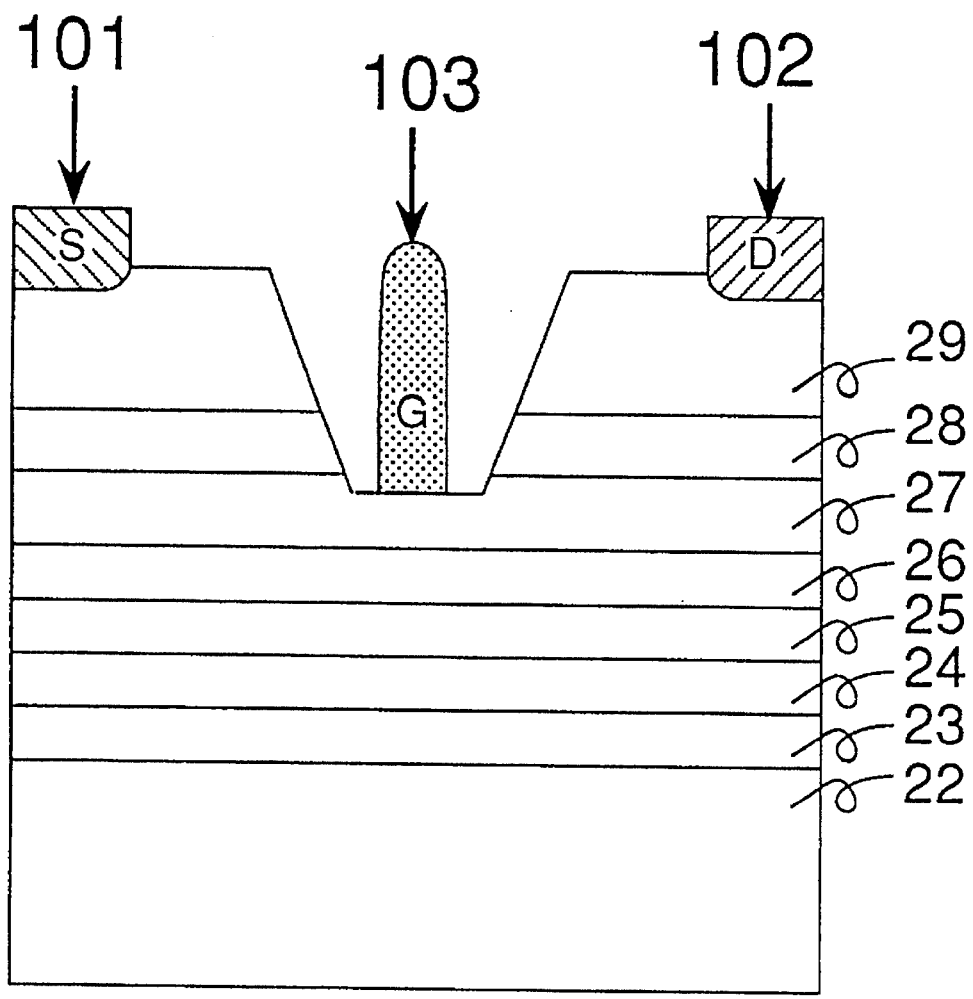
FIG. 2 is a sectional view of a conventional FET.
Figure 3:
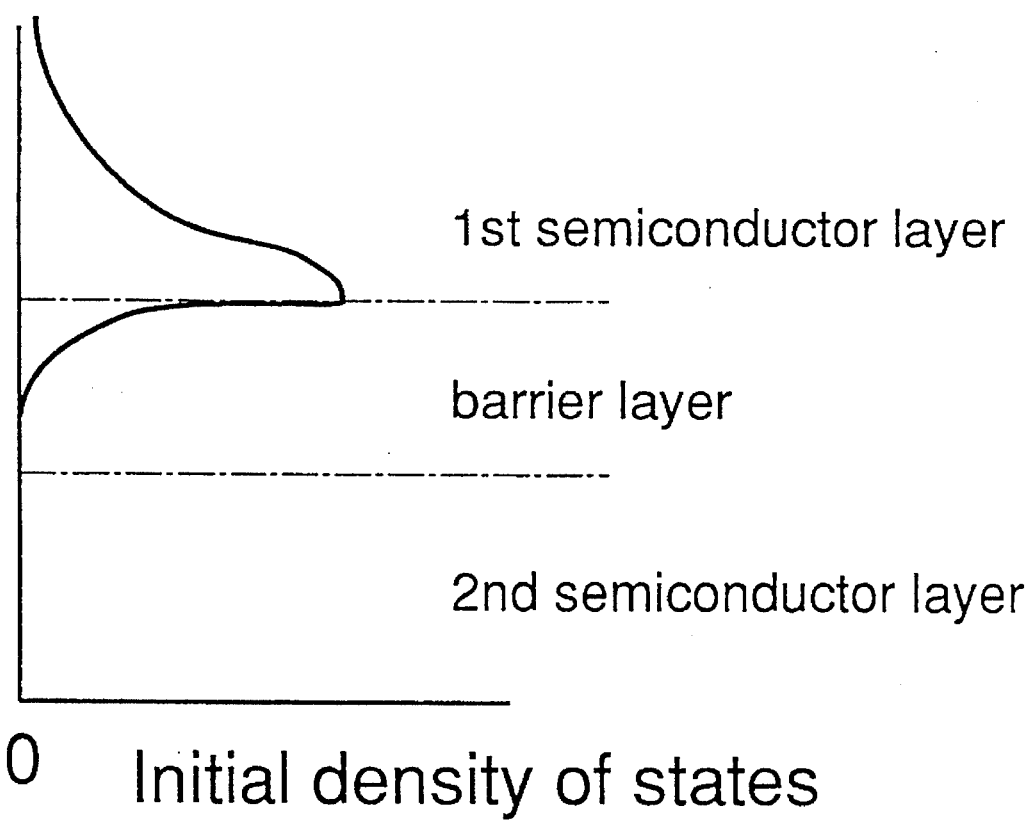
FIG. 3 is an initial and final state distribution diagram illustrating a principle of the present invention.
Figure 4:
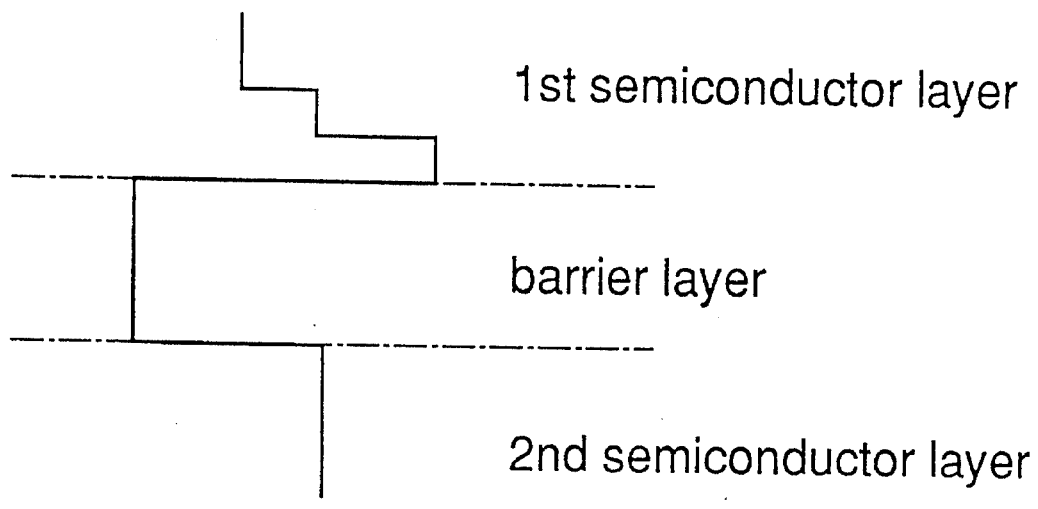
FIG. 4 is an ionized impurity distribution chart illustrating a principle of the present invention.
Figure 15:
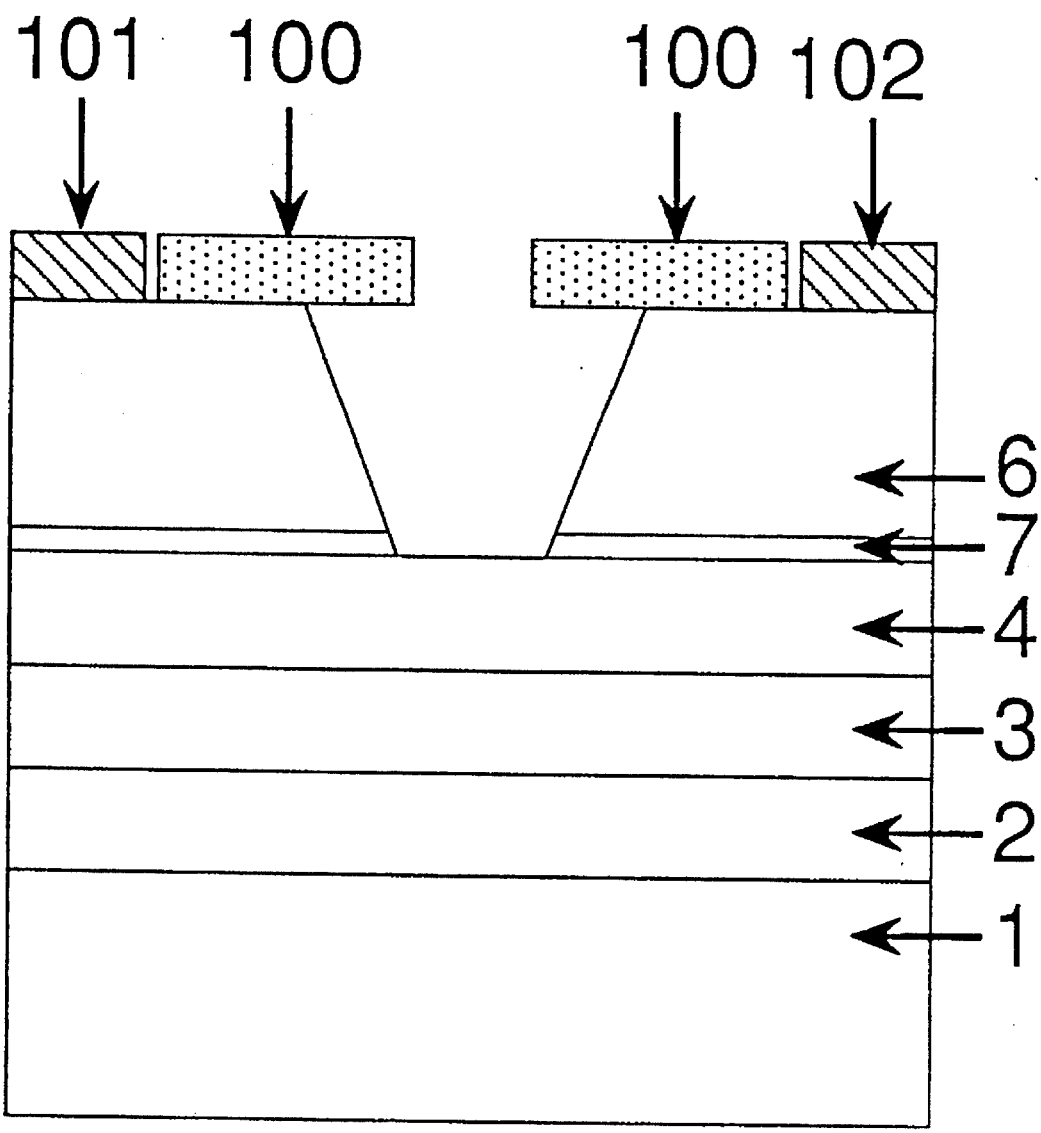
FIG. 15 is a sectional view of another semiconductor device embodying the present invention.

FIG. 15 is a sectional view of a second example of the present invention. First, an undoped GaAs layer 2 (500 nm thick), an n-GaAs channel layer 3 (thickness:10 nm, Si concentration: $3 \times 10^{18}/cm^3$), an undoped AlGaAs barrier layer (Al composition: 0.3, thickness: 20 nm), an n-GaAs layer 7 (thickness: 10 nm, Si concentration: $5 \times 10^{18}/cm^3$), and an n-GaAs cap layer 6 (thickness: 50 nm, Si concentration: $3 \times 10^{18}/cm^3$) were successively stacked by MBE on a semi-insulating GaAs substrate 1 in the above order. FIG. 15 is an example of the principle of FIG. 4, since the layer 7 is the same material as layer 6, but has a higher ionized impurity density to create a higher-carrier concentration adjacent to the barrier layer (noting that in this example the ionized impurities are donors).

Subsequently, element-to-element isolation was carried out by cutting down the undoped GaAs layer 2 up to its mid-part by mesa etching, and then a cathode electrode 101 and an anode electrode 102 were formed by lift-off. AuGe/Mo/Au was used as a cathode and anode electrode material, which was evaporated before being alloyed (at 400° C. for 5 min) in an N2 atmosphere. A lift-off mask prepared by making an opening in an SiO2 film 100 through the ordinary photolithographic process was used. Moreover, the opening in the SiO2 film 100 was side-etched by wet etching so as to give it a form to be ready for lift-off. Further, the photolithographic process was used to make the opening in a desired part of the SiO2 film 100 between the two electrodes. The cathode and anode electrodes were then separated sufficiently so as to conceal the effect resulting from alloying, both being fixedly set apart by 2 μm from the opening. When the electrodes were separated from the opening by more than 1.5 μm, the result was seen not to vary appreciably. Afterwards, the n-GaAs cap layer 6 and the n-InGaAs layer 5 under the opening portion were removed by dry and wet etching under efficient control with the SiO2 film 100 as a mask. Incidentally, the dimension of the opening was continuously varied from 1 to 150 μm. The structure of the FET shown in FIG. 11 was thus acquired.

Figure 16:
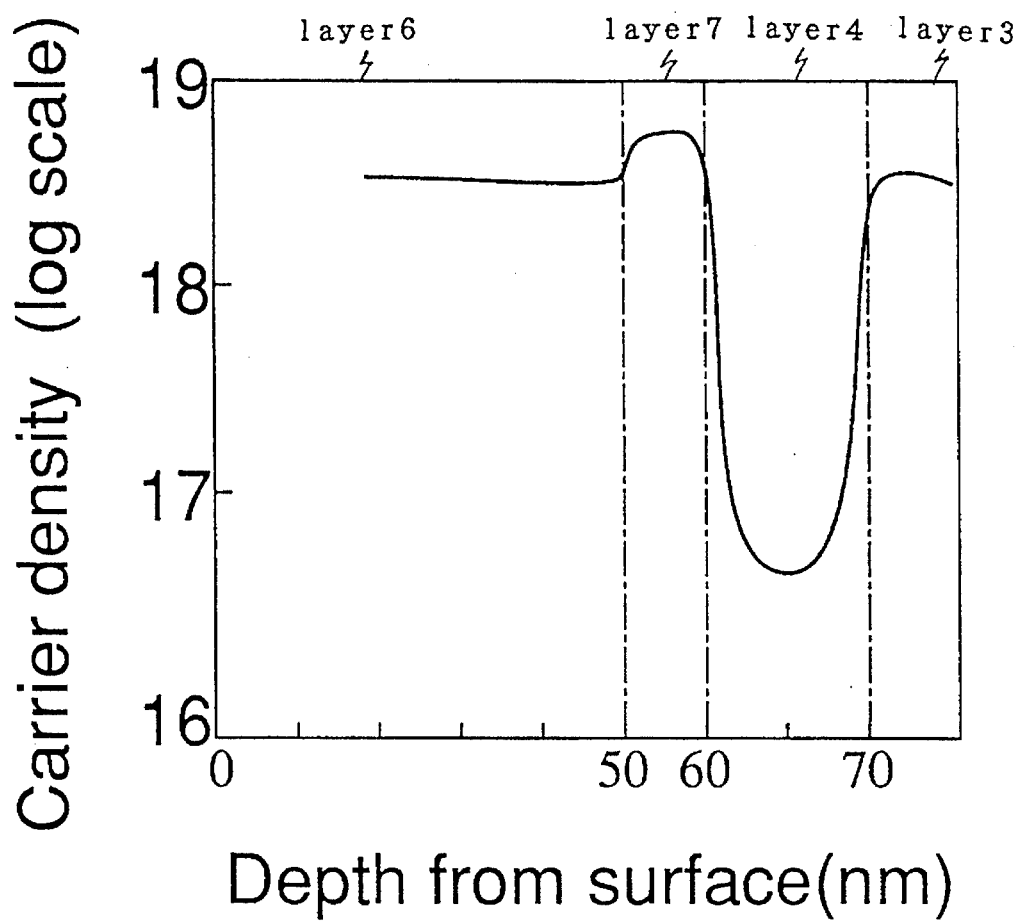
FIG. 16 shows a carrier profile measured by polaron measurement with reference to semiconductor device of FIG. 15.

High performance at a level of 0.27 Ω·mm was attained by this example of a semiconductor device. FIG. 16 shows a carrier profile in the direction of depth taken by polaron measurement in this example, wherein the electron concentration on the side of the barrier layer 4 of the semiconductor layers 5, 6 is seen to remain higher than that in the remaining portion. In particular, the high electron concentration in the layer 7 is a result of its higher ionized impurity density, as discussed previously.

Although the ionized impurity concentrations in the n-GaAs layers 7, 6 were set as stated above, the combination of concentrations is not limited to this example. A similar effect was achieved even when the concentration in the semiconductor layer 7 was greater by more than 30% than that in the semiconductor layer 6. Moreover, an excellent effect is confirmable when the layer structure, which may be not only a double-layer structure but also a multilayer one, has the distribution of the ionized impurity concentration varying in a steplike manner or continuously and what is high on the side of the barrier layer 4.

The conditions in the first and second examples may be altered as follows. A similar effect is achievable even if a method of controlling the growth with an atomic layer as a unit, namely, the MOCVD method or the like, in place of the MBE method, is employed as an epitaxial crystalline growth method. Although the AlGaAs layer 4 was made 20 nm thick, its thickness may range from 2 to 50 nm to achieve a similar effect. With respect to the material of the barrier layer, it is not restricted to AlGaAs but may be any material having electron affinity less than that of the materials of the channel layer 3 and the cap layer 6 with electrons as carriers or what has the sum of the electron affinity and the band gap greater than that of those materials with positive holes as carriers. The barrier need not be of a signal layer but may be of a multilayer having different impurity concentrations or what will not form the heterojunction such as an oxide film and the like in order to achieve a similar effect. Moreover, the ionized impurity concentration in the n-GaAs channel layer 3 is not particularly restricted, and may be undoped layer whose material may also be InGaAs, InGaAsSb and the like. Further, the concentration need not always be uniform, and an excellent effect is achievable in a case where it is lower on the substrate side and high on the barrier side. The undoped GaAs layer 2 need not be a signal layer but may have a GaAsAlGaAs super lattice structure, for example. Part of the undoped layer 2 or the barrier layer 4 may be what contains ionized impurities. The n-InGaAs layer 5 need not be uniform in structure but may be such that the In composition increases in the vicinity of its surface, for example. The ohmic electrode may be formed with the omission of the alloying process. As the whole current flows through the tunnel during the process excluding the alloying like this, the effect of the present invention becomes conspicuous.

Although electrons were employed as the carriers in this example, positive holes may be used as well to achieve a similar effect and p-type ionized impurities may be used in each semiconductor layer at this time.

EXAMPLE 3

Figure 17:
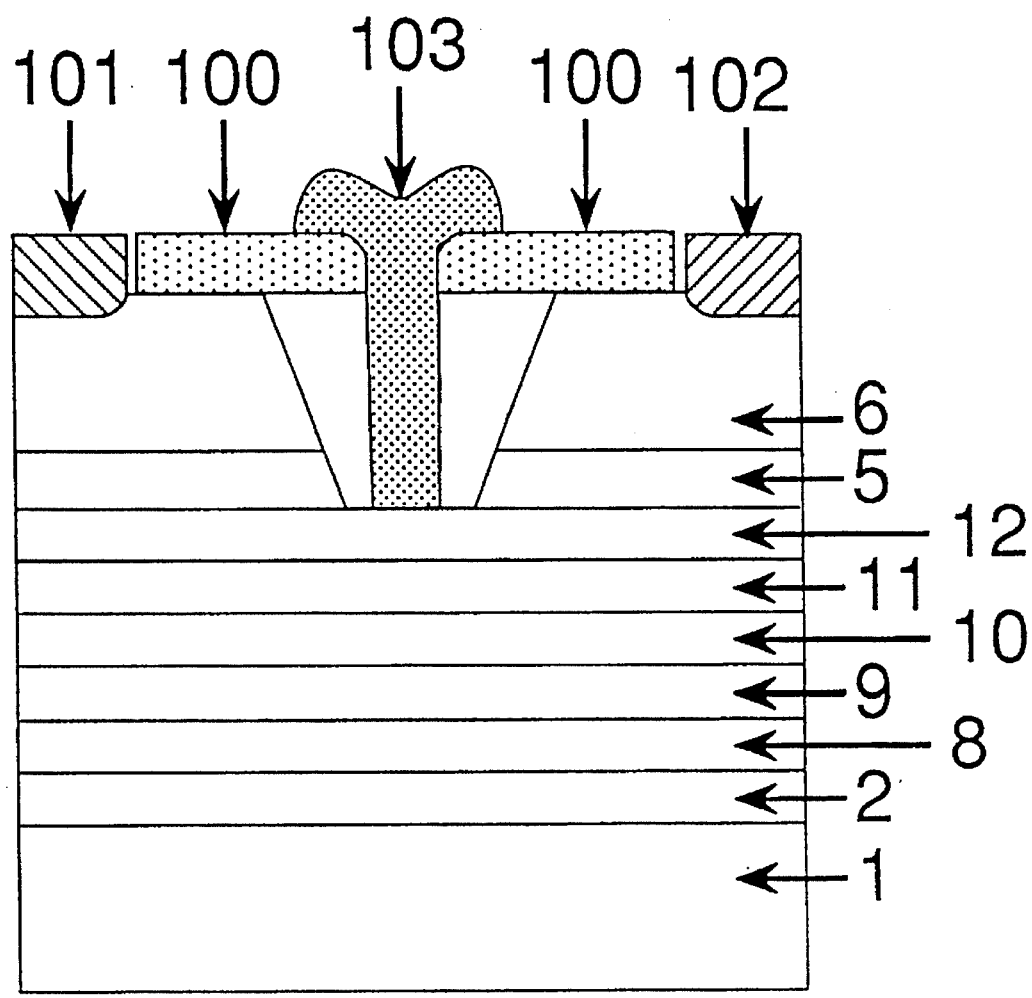
FIG. 17 is a sectional view of another FET according to the present invention.

FIG. 17 is a sectional view of a third example of the present invention. First, an undoped GaAs layer 2 (200 nm thick), an undoped AlGaAs/undoped GaAs superlattice layer 8 (thickness: 3/50 nm×5), an undoped InGaAs channel layer 9 (In composition: 0.25, thickness: 8 nm), an undoped AlGaAs spacer layer 10 (Al composition: 0.25, thickness: 2 nm), an n-AlGaAs carrier supply layer 11 (Al composition: 0.25, thickness: 20 nm, Si concentration: $2.3\times10^{18}/cm^3$), an undoped AlGaAs layer 12 (Al composition: 0.25, thickness: 10 nm), and an n-InGaAs layer 5 (In composition: 0.2, thickness: 10 nm, $3\times10^{18}/cm^3$) were successively grown by MBE on a semi-insulating GaAs substrate 1 in the above order, and lastly an n-GaAs cap layer 6 (Si concentration: $3\times10^{18}/cm^3$, thickness: 150 nm) was piled on top of the combination above.

Subsequently, element-to-element isolation was carried out by means of mesa etching and then a source electrode 101 and a drain electrode 102 were formed by lift-off. AuGe/Mo/Au was used as a source and drain electrode material, which was evaporated before being alloyed (at 400° C. for 5 min) in an N2 atmosphere. A lift-off mask prepared by making an opening in an SiO2 film 100 through the ordinary photolithographic process was used. Moreover, the opening in the SiO2 film 100 was side-etched by wet etching so as to give it a form to be ready for lift-off. Further, the n-GaAs cap layer 6 was etched by about 40 nm by wet etching. Then a gate electrode 103 having a length of 0.1 µm and a width of 200 µm was formed by lift-off on the undoped AlGaAs layer 11. Al was used as gate electrode material and EB (Electron Beam) lithography was also used to form the gate pattern. The n-InGaAs layer 5 and the n-GaAs cap layer 6 were removed by wet etching and selective dry etching with the SiO2 film 100 as a mask. The structure of the FET shown in FIG. 17 was thus acquired in this manner.

Figure 7:
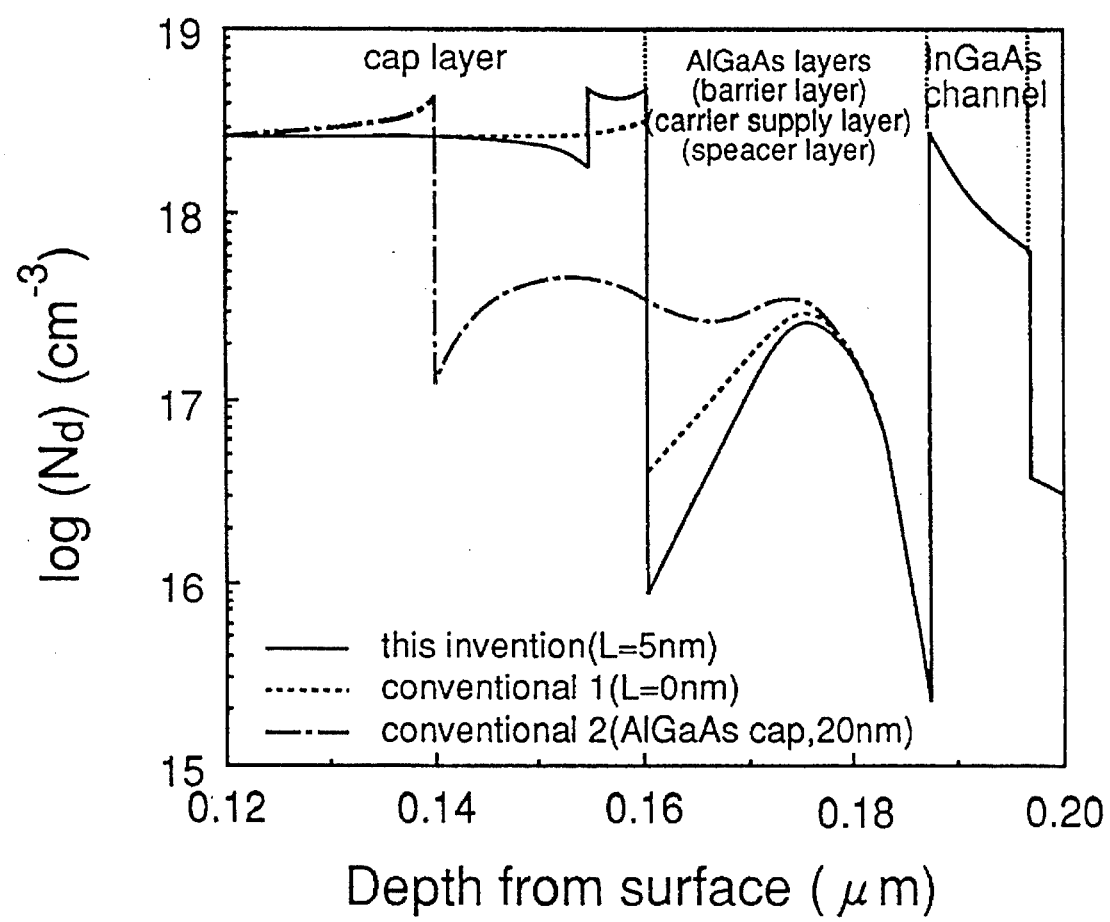
FIG. 7 is an electron density distribution chart comparing conventional examples and the present invention.
Figure 8:
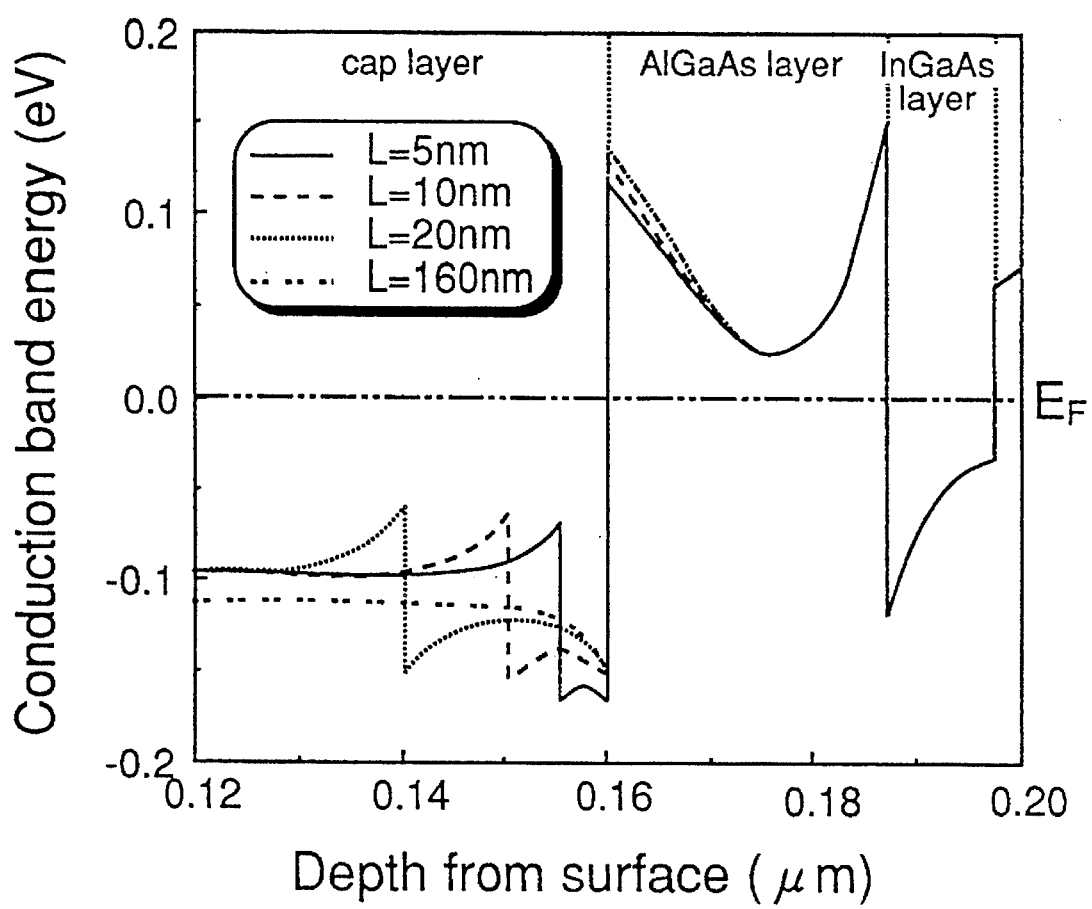
FIG. 8 is a band diagram illustrating an embodiment of the present invention.
Figure 9:
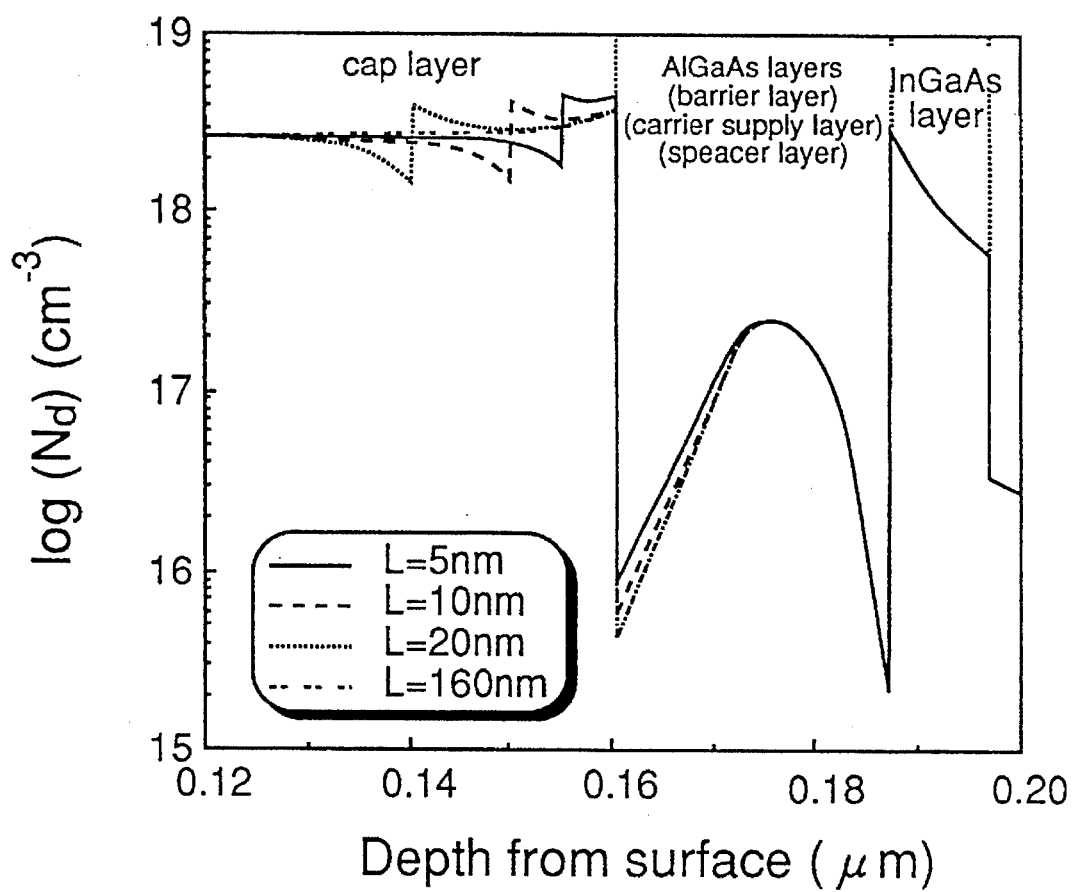
FIG. 9 an electron density distribution chart illustrating an embodiment of the present invention.
Figure 10:
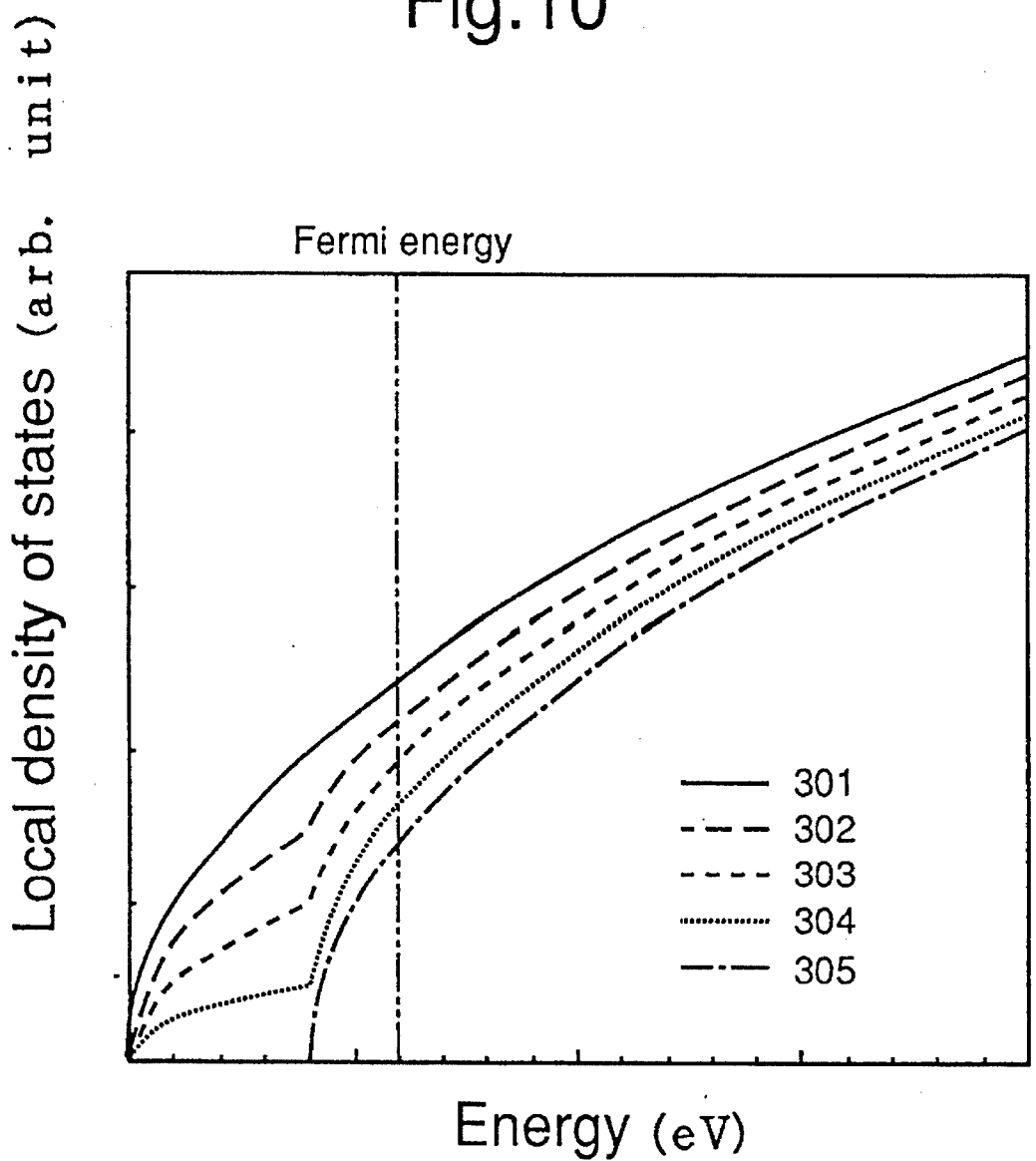
FIG. 10 is a local density of state graph illustrating an embodiment of the present invention.

The FET of FIG. 17 is based on using different materials with different electron affinities, as explained with regard to FIG. 5. In this embodiment, layers 10, 11 and 12 are barrier layers and layer 9 is equivalent to the lower semiconductor layer 2 of FIG. 5. Layer 5 of FIG. 17 corresponds to the high electron affinity semiconductor layer 3 of FIG. 5, while layer 6 of FIG. 7 corresponds to the lower electron affinity semiconductor layer 6 of FIG. 5 (noting that layers 5 and 6 are different materials).

The performance of the semiconductor device in this example is superior in that the device has the following characteristics: source resistance R: 0.3 Ω·mm, the transconductance $g_m$: 195 mS/mm at 2 mA drain current, the noise figure NF at 2 GHz=0.32 dB, and the minimum value of the noise figure at 12 GHz=0.38 dB.

Although the In composition of the n-InGaAs layer 5 in this example was invariable, the effect of the invention will become conspicuous if there is employed such a structure that an InGaAs layer different in the In composition and as thin as several~several ten nm varies in a steplike manner or in which the In composition continuously varies and is great on the side of the barrier layer 4.

EXAMPLE 4

Figure 18:
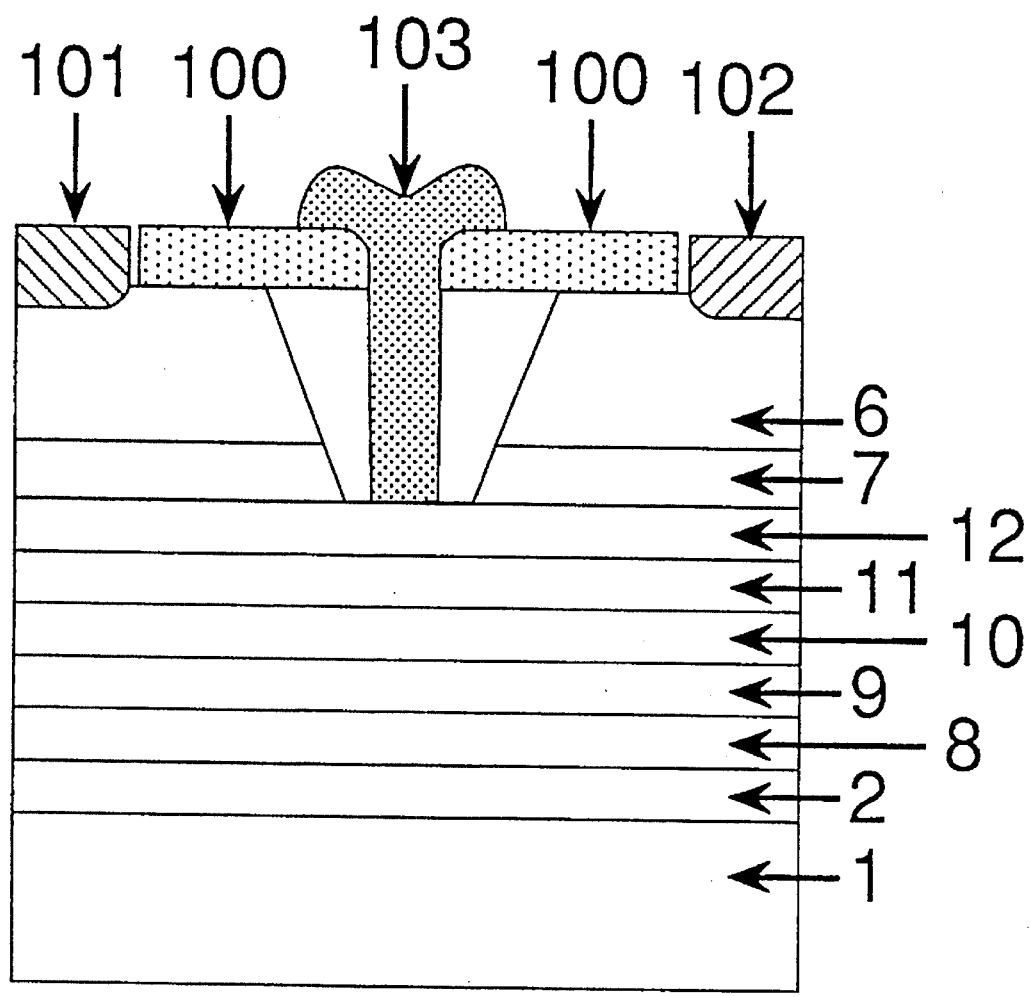
FIG. 18 is a sectional view of another FET according to the present invention.

FIG. 18 is a sectional view of a fourth example of the present invention. First, an undoped GaAs layer 2 (200 nm thick), an undoped AlGaAs/undoped GaAs superlattice layer 8 (thickness: 3/50 nm×5), an undoped InGaAs channel layer 9 (In composition: 0.25, thickness: 8 nm), an undoped AlGaAs spacer layer 10 (Al composition: 0.25, thickness: 2 nm), an n-AlGaAs carrier supply layer 11 (Al composition: 0.25, thickness: 20 nm, Si concentration: $2.3\times10^{18}/cm^3$), an undoped AlGaAs layer 12 (Al composition: 0.25, thickness: 10 nm), and an n-GaAs layer 7 (thickness: 10 nm, $5\times10^{18}/cm^3$) were successively grown by MBE on a semi-insulating GaAs substrate 1 in the above order, and lastly an n-GaAs cap layer 6 (Si concentration: $3\times10^{18}/cm^3$ thickness: 150 nm) was piled on top of the combination above.

Subsequently, element-to-element isolation was carried out by means of mesa etching and then a source electrode 101 and a drain electrode 102 were formed by lift-off. AuGe/Mo/Au was used as a source and drain electrode material, which was evaporated before being alloyed (at 400° C. for 5 min) in an N2 atmosphere. A lift-off mask prepared by making an opening in an SiO2 film 100 through the ordinary photolithographic process was used. Moreover, the opening in the SiO2 film 100 was side-etched by wet etching so as to give it a form to be ready for lift-off. Further, the n-GaAs cap layer 6 was etched by about 40 nm by wet etching. Then a gate electrode 103 having a length of 0.1 µm and a width of 200 µm was formed by lift-off on the undoped AlGaAs layer 11. Al was used as gate electrode material and EB (Electron Beam) lithography was also used to form the gate pattern. The n-InGaAs layer 5 and the n-GaAs cap layer 6 were removed by wet etching and selective dry etching with the SiO2 film 100 as a mask. The structure of the FET shown in FIG. 18 was thus acquired in this manner.

The performance of the semiconductor device in this example was superior in that the device had the following characteristics: source resistance R: 0.32 Ω·mm, the transconductance $g_m$:183 mS/mm at 2 mA drain current, the noise figure NF at 2 GHz=0.35 dB, and the minimum value of the noise figure at 12 GHz=0.40 dB.

Although the ionized impurity concentrations in the n-GaAs layers 7, 6 were set as stated above, the combination of concentrations is not limited to this example. Similar effects were achieved even when the concentration in the semiconductor layer 7 was greater by more than 30% than that in the semiconductor layer 6. Moreover, an excellent effect is achievable when the layer structure, which may be not only a double-layer structure but also a multilayer one, has the distribution of the ionized impurity concentration varying in a steplike manner or continuously and what is high on the side of the un-doped AlGaAs layer 12.

EXAMPLE 5

Figure 19:
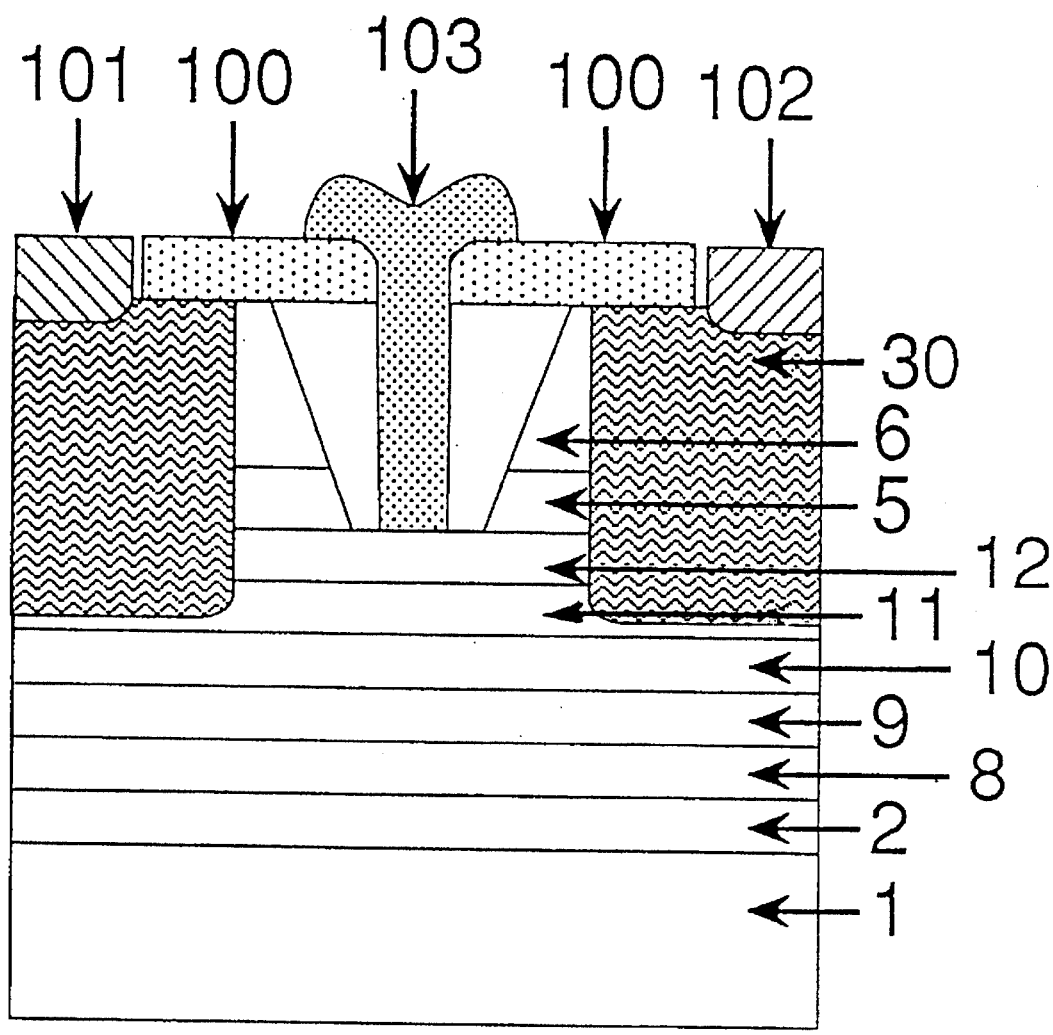
FIG. 19 is a sectional view of still another FET according to the present invention.

FIG. 19 is a sectional view of a fifth example of the present invention. First, an undoped GaAs layer 2 (200 nm thick), an undoped AlGaAs/undoped GaAs superlattice layer 8 (thickness: 3/50 nm×5), an undoped InGaAs channel layer 9 (In composition: 0.25, thickness: 8 nm), an undoped AlGaAs spacer layer 10 (Al composition: 0.25, thickness: 2 nm), an n-AlGaAs carrier supply layer 11 (Al composition: 0.25, thickness: 20 nm, Si concentration: $2.3 \times 10^{18}/cm^3$), an undoped AlGaAs layer 12 (Al composition: 0.25, thickness: 10 nm), and an n-InGaAs layer 5 (In composition: 0.2, thickness: 10 nm, $3 \times 10^{18}/cm^3$) were successively grown by MBE on a semi-insulating GaAs substrate 1 in the above order, and lastly an n-GaAs cap layer 6 (Si concentration: $3 \times 10^{18}/cm^3$, thickness: 150 nm) was piled on top of the combination above.

Subsequently, element-to-element isolation was carried out by means of mesa etching and then an SiO2 film 100 was formed to make a hole for the source drain electrode region. The SiO2 film 100 and the cap layer 6 were removed by dry etching under efficient control up to this side of the n-InGaAs layer 5 and further removed by wet etching up to the mid-portion of the n-AlGaAs layer 11. The wet etching may be replaced with the dry etching. Then an n-GaAs selective growth layer 30 was selectively grown by MOCVD in only an opening. Subsequently, a source electrode 101 and a drain electrode 102 were formed by lift-off. AuGe/MO/Au was used as a source-drain electrode material, which was evaporated before being alloyed (at 400° C. for 5 min) in an N2 atmosphere. A lift-off mask prepared by making the opening in the SiO2 film 100 through the ordinary photolithographic process was used. Moreover, the opening in the SiO2 film 100 was side-etched by wet etching so as to give it a form to be ready for lift-off. Further, the n-GaAs cap layer 6 was etched by about 40 nm by wet etching. Then a gate electrode 103 having a length of 0.1 μm and a width of 200 μm was formed by lift-off on the undoped AlGaAs layer 11. Al was used as gate electrode material and EB (Electron Beam) lithography was also used to form the gate pattern. The n-InGaAs layer 5 and the n-GaAs cap layer 6 were removed by wet etching and selective dry etching with the SiO2 film 100 as a mask. The structure of the FET shown in FIG. 19 was thus acquired in this manner.

The performance of the semiconductor device in this example was superior in that the device has the following characteristics: source resistance R: 0.22 Ω·mm, the transconductance $g_m$:206 mS/mm at 2 mA drain current, the noise figure NF at 2 GHz=0.30 dB, and the minimum value of the noise figure at 12 GHz=0.34 dB.

Although the In composition of the n-InGaAs layer 5 in this example was invariable, the effect of the invention will become conspicuous if there is employed such a structure that an InGaAs layer different in the In composition and as thin as several~several ten nm varies in a steplike manner or in which the In composition continuously varies and is great on the side of the barrier layer 4.

Although the process of having the gate and source and drain regions self-aligned was shown by way of example herein, any other process may be utilized. More specifically, applicable methods are a method of forming a high melting-point gate electrode first and a selective growth layer by making use of the electrode and the oxide sidewall thereof and a method of forming a gate electrode by utilizing the selective growth layer.

Moreover, an AlGaAs layer may selectively be grown after the source and drain electrode region is continuously grown.

EXAMPLE 6

Figure 20:
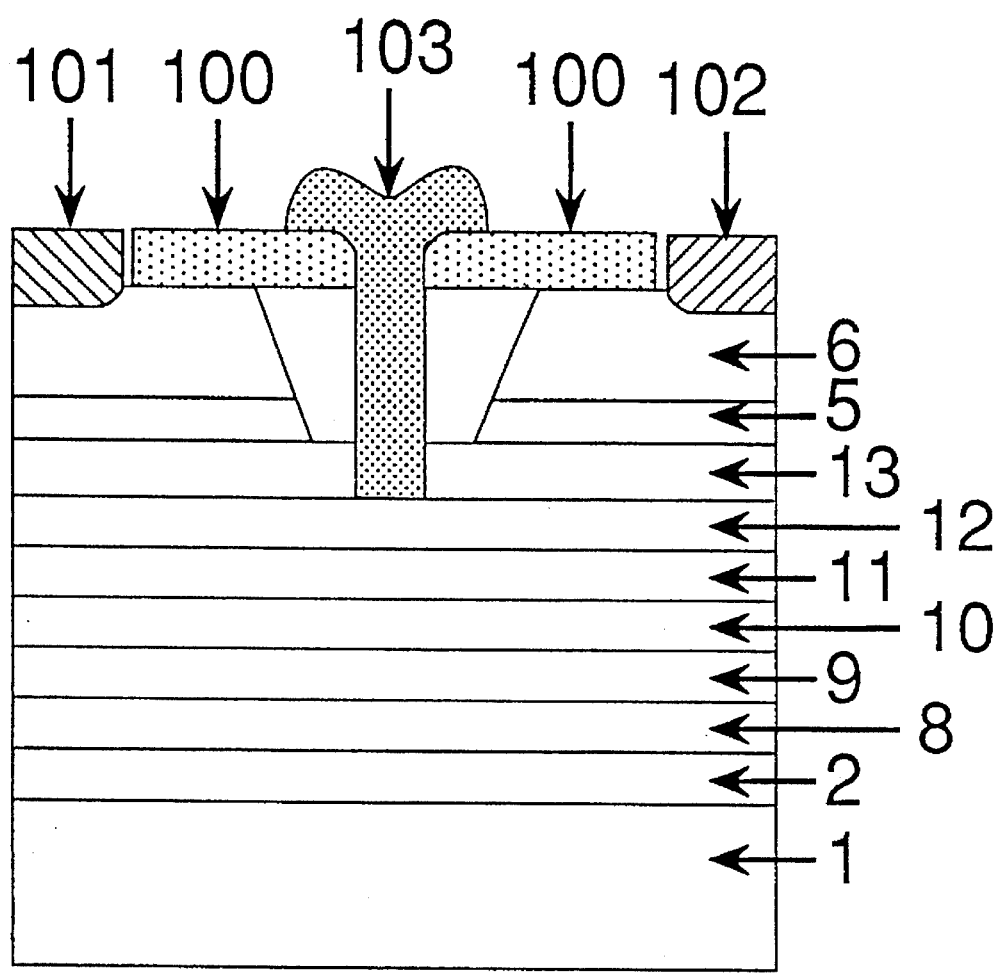
FIG. 20 is a sectional view of still another FET according to the present invention.

FIG. 20 is a sectional view of a sixth example of the present invention. First, an undoped GaAs layer 2 (200 nm thick), an undoped AlGaAs/undoped GaAs superlattice layer 8 (thickness: 3/50 nm×5), an undoped InGaAs channel layer 9 (In composition: 0.25, thickness: 8 nm), an undoped AlGaAs spacer layer 10 (Al composition: 0.25, thickness: 2 nm), an n-AlGaAs carrier supply layer 11 (Al composition: 0.25, thickness: 20 nm, Si concentration: $2.3 \times 10^{18}/cm^3$), an undoped AlGaAs layer 12 (Al composition: 0.25, thickness: 8 nm), an n-GaAs layer 13 (thickness 20 nm, Si concentration: $0.5 \times 10^{18}/cm^3$), and an n-InGaAs layer 5 (In composition: 0.2, thickness: 10 nm, $3 \times 10^{18}/cm^3$) were successively grown by MBE on a semi-insulating GaAs substrate 1 in the above order, and lastly an n-GaAs cap layer 6 (Si concentration: $3 \times 10^{18}/cm^3$, thickness: 150 nm) was piled on top of the combination above.

Subsequently, element-to-element isolation was carried out by means of mesa etching and then a source electrode 101 and a drain electrode 102 were formed by lift-off. AuGe/Mo/Au was used as a source and drain electrode material, which was evaporated before being alloyed (at 400° C. for 5 min) in an N2 atmosphere. A lift-off mask prepared by making an opening in an SiO2 film 100 through the ordinary photolithographic process was used. Moreover, the opening in the SiO2 film 100 was side-etched by wet etching so as to give it a form to be ready for lift-off. Further, the n-GaAs cap layer 6 was etched by about 40 nm by wet etching. Then a gate electrode 103 having a length of 0.1 μm and a width of 200 μm was formed by lift-off on the undoped AlGaAs layer 11. Al was used as gate electrode material and EB (Electron Beam) lithography was also used to form the gate pattern. The n-GaAs cap layer 6, the n-InGaAs layer 5, and the n-GaAs layer 13 were removed by wet etching and selective dry etching twice with the SiO2 film 100 as a mask. The structure of the FET shown in FIG. 20 was thus acquired in this manner.

The performance of the semiconductor device in this example, which was an enhancement FET at a threshold voltage of 0.2 V, was superior in that the device has the following characteristics: source resistance R: 0.31 Ω·mm, the transconductance $g_m$: 228 mS/mm at 2 mA drain current, the noise figure. NF at 2 GHz=0.28 dB, and the minimum value of the noise figure at 12 GHz=0.32 dB.

Although the In composition of the n-InGaAs layer 5 in this example was invariable, the effect of the invention will become conspicuous if there is employed such a structure that an InGaAs layer different in the In composition and as thin several~several ten nm varies in a steplike manner or in which the In composition continuously varies and is great on the side of the barrier layer 4.

The n-GaAs layer 13 may be concentrated to the extent that the gate breakdown voltage is not deteriorated, that is, at not greater than about $3 \times 10^{18}/cm^3$ and it may be of an undoped type. Moreover, that layer should preferably be thinner to the extent that the sheet resistance in the channel layer under the gate electrode neighborhood is not deteriorated. The thickness is closely related to the threshold voltage of FET and it is effective to increase the thickness as the threshold voltage ham a greater positive value and to decrease it as the threshold voltage has a greater negative value.

Like the fifth example, the ohmic contact with the selective growth may be used simultaneously. Moreover, the concentration may be higher than that of the n-InGaAs layer 5.

EXAMPLE 7

Figure 21:
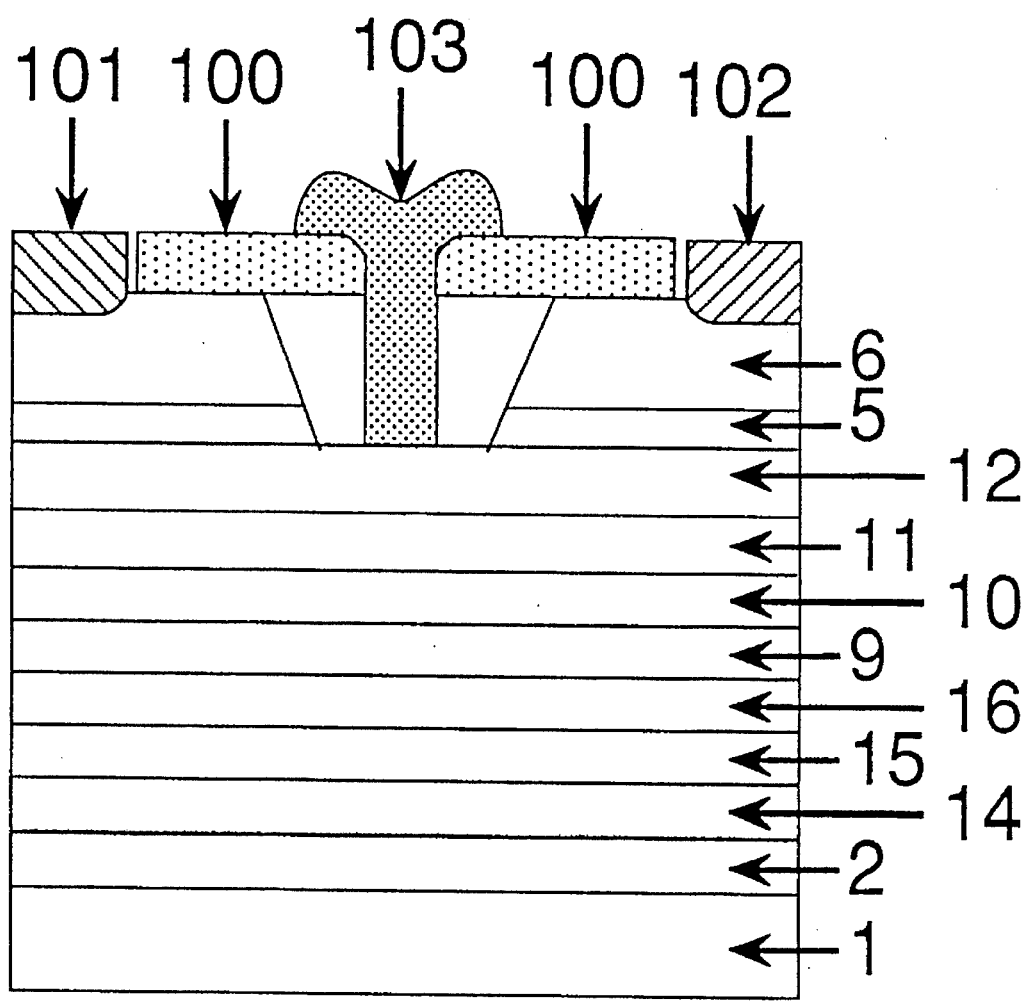
FIG. 21 is a sectional view of a high power FET according to the present invention.

FIG. 21 is a sectional view of a seventh example of the present invention. First, an undoped GaAs layer 2 (200 nm thick), an undoped AlGaAs layer 14 (Al composition: 0.25, thickness: 150 nm), an n-AlGaAs carrier supply layer 15 (Al composition: 0.25, thickness: 10 nm, Si concentration: $2.3 \times 10^{18}/cm^3$), an undoped AlGaAs spacer layer 16 (Al composition: 0.25, thickness: 2 nm), an undoped InGaAs channel layer 9 (In composition: 0.25, thickness: 8 nm), an undoped AlGaAs spacer layer 10 (Al composition: 0.25, thickness 2 nm), an n-AlGaAs carrier supply layer 11 (Al composition: 0.25, thickness: 10 nm, Si concentration: $2.3 \times 10^{18}/cm^3$), an undoped AlGaAS layer 12 (Al composition: 0.25, thickness: 8 nm), and an n-InGaAs layer 5 (In composition: 0.2, thickness: 10 nm, $3 \times 10^{18}/cm^3$) were successively grown by MBE on a semi-insulating GaAs substrate 1 in the above order, and lastly an n-GaAs cap layer 6 (Si concentration: $3 \times 10^{18}/cm^3$, thickness: 60 nm) was piled on top of the combination above.

Subsequently, element-to-element isolation was carried out by means of mesa etching and then a source electrode 101 and a drain electrode 102 were formed by lift-off. AuGe/Mo/Au was used as a source and drain electrode material, which was evaporated before being alloyed (at 400° C. for 5 min) in an N2 atmosphere. A lift-off mask prepared by making an opening in an SiO2 film 100 through the ordinary photolithographic process was used. Moreover, the opening in the SiO2 film 100 was side-etched by wet etching so as to give it a form to be ready for lift-off. Further, the n-GaAs cap layer 6 was etched by about 40 nm by wet etching. Then a gate electrode 103 having a length of 0.1 µm and a width of 200 µm was formed by lift-off on the undoped AlGaAs layer 11. Al was used as gate electrode material and EB (Electron Beam) lithography was also used to form the gate pattern. The n-GaAs cap layer 6, the n-InGaAs layer 5, and the n-GaAs layer 13 were removed by wet etching and selective dry etching twice with the SiO2 film 100 as a mask. The structure of the FET shown in FIG. 21 was thus acquired in this manner.

The performance of the semiconductor device in this example was superior in that the device had the following characteristics: source resistance R: 0.31 Ω·mm, the gain compression output power at 12 GHz=40 dB, the power added efficiency at 30%, and the power gain at 10 dB.

Although the In composition of the n-InGaAs layer 5 in this example was invariable, the effect of the invention will become conspicuous if there is employed such a structure that an InGaAs layer different in the In composition and as thin as several~several ten nm varies in a steplike manner or in which the In composition continuously varies and is great on the side of the barrier layer 4.

Like the fifth example, the ohmic contact with the selective growth may be used simultaneously. Moreover, the concentration may be higher than that of the n-InGaAs layer 5.

The conditions in the third, fourth, sixth and seventh examples may be altered as follows. Similar effects are achievable even if a method of controlling the growth with an atomic layer as a unit, namely, the MOCVD method or the like, in place of the MBE method, is employed as an epitaxial crystalline growth method. Not only EB lithography but also photo-, excima-laser- or X-ray lithography may be used to form the gate. With respect to the insulating film, not only SiO2 but also SiN, PSG or the combination of them may be used simultaneously. Although the undoped AlGaAs spacer layer 10 was made 2 nm thick, its thickness may range from 1 to 4 nm to achieve favorable results. Moreover, the ionized impurity concentration in the n-AlGaAs carrier supply layer 11 is not restricted to what has been defined above but may be within the range of $1\sim10 \times 10^{18}/cm^3$ to achieve favorable results. Further, the use of a planar doping layer or the simultaneous use of a uniform doping and a planar doping layer may improve the characteristics. Not only GaAs but also a material which makes the ohmic contact readily attainable, that is, InGaAs or the like, for example, may be used for the cap layer 6. As long as the breakdown voltage is not deteriorated, n-AlGaAs at not greater than $1 \times 10^{18}/cm^3$ may be used for the undoped AlGaAs layer 12 beneath the gate. Although the Al composition in the AlGaAs layers 10, 11, 12 has been set at 0.25 in value, the same result is achievable by ranging the value from 0.15 up to about 0.4. InGaAs with the In composition: 0.25 was employed for the channel layer 4, which may be as thick as to allow no dislocation with the In composition from 0.1 to about 0.4. The material is not restricted to InGaAs but may be GaAsSb for use. Moreover, the same result is obtained from the use of not only InGaAs/AlGaAs but also combinations of GaAs/AlGaAs, InGaAs/InAlAs and InAs/(Al, Ga)(Sb, As) as materials for the structure of the channel layer/carrier supply layer. InP as well as GaAs may be used for the substrate material. When an InP substrate is used, InAlAs with the In composition: 0.3~0.6 in place of the AlGaAs mentioned above and InGaAs with the In composition: 0.4~0.7 in place of the GaAs layer may be used to achieve favorable results. Such materials other than Si as S, Se and the like may be used for the dopant. Favorable results are also obtainable from a P-channel FET, though the N-channel FET was used by way of example. In this case, the N doping layer should be replaced with the P doping layer for the purpose. Moreover, favorable results are, needless to say, obtainable from other heterojunction elements including inverse HEMT and doping channel type FETs, though HEMT has been described previously.

EXAMPLE 8

Figure 22:
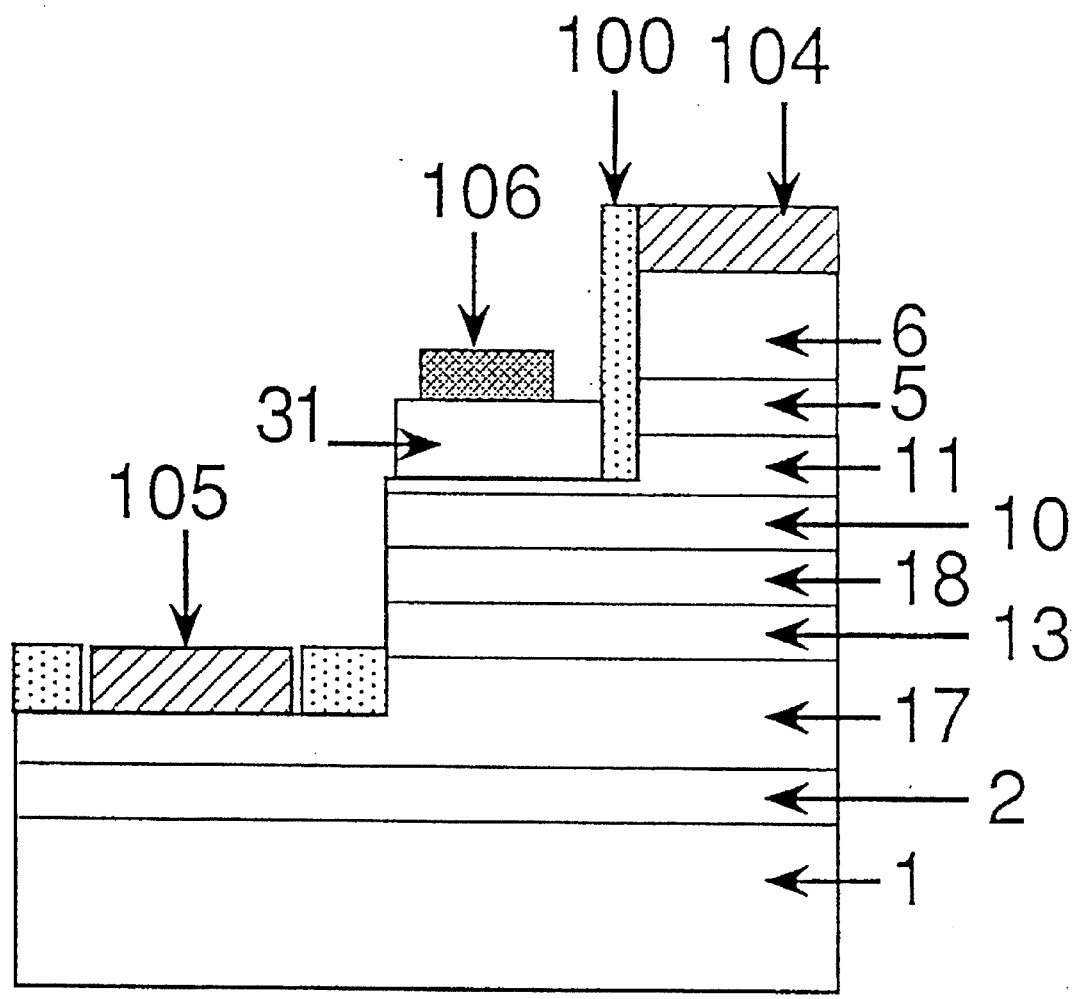
FIG. 22 is a sectional view of an HBT according to the present invention.

FIG. 22 is a sectional view of an eighth example of the present invention. First, an undoped GaAs layer 2 (200 nm thick), a high-concentration n-GaAs (thickness: 500 nm, Si concentration: $5 \times 10^{18}/cm^3$) collector layer 17, a low-concentration n-GaAs (thickness: 400 nm, Si concentration: $5 \times 10^{16}/cm^3$) 13, a P-GaAs (thickness: 100 nm, Be concentration: $5 \times 10^{19}/cm^3$) base layer 18, an undoped GaAs spacer layer 10 (thickness: 3 nm), an n-AlGaAs layer 11 (Al composition: 0.3, thickness: 150 nm, Si concentration: $5 \times 10^{18}/cm^3$), and an n-InGaAs layer 5 (In composition: 0.25, thickness: 10 nm, $3 \times 10^{18}/cm^3$) were successively grown by MBE on a semi-insulating GaAs substrate 1 in the above order, and lastly an n-GaAs cap layer 6 (Si concentration: $5 \times 10^{18}/cm^3$, thickness: 200 nm) was piled on top of the combination above.

Subsequently, element-to-element isolation was carried out by means of mesa etching and then an emitter electrode 104 and a collector electrode 105 were formed by lift-off. AuGe/Mo/Au was used as an emitter collector electrode material, which was evaporated before being alloyed (at 400° C. for 5 min) in an N2 atmosphere. A lift-off mask prepared by making an opening in an SiO2 film 100 through the ordinary photolithographic process was used. Moreover, the opening in the SiO2 film 100 was side-etched by wet etching so as to give it a form to be ready for lift-off. Further, a desired crystalline portion in the collector electrode region was removed by etching up to the mid-portion of the highly doped n-GaAs layer 17. Then a side wall of SiO2 film was formed around the emitter electrode and etching was applied so as to secure the base electrode region in self-alignment with the emitter electrode. At that time, the p-GaAs base layer 18 was removed up to this side thereof. The side wall of SiO2 film was further formed to secure the breakdown voltage between the intrinsic HBT region and a base electrode and a p-GaAs layer 31 was also formed selectively by MOCVD. In addition, a base electrode 106 was formed by lift-off in part of the upper portion of the selective growth layer. Au/Mo/AuZn/Mo/Au was for use as the electrode material. In this manner, the HBT of FIG. 22 was prepared. With this HBT offering high emitter injection efficiency, the base resistance could be lowered to ⅔ of the conventional case.

EXAMPLE 9

Figure 23:
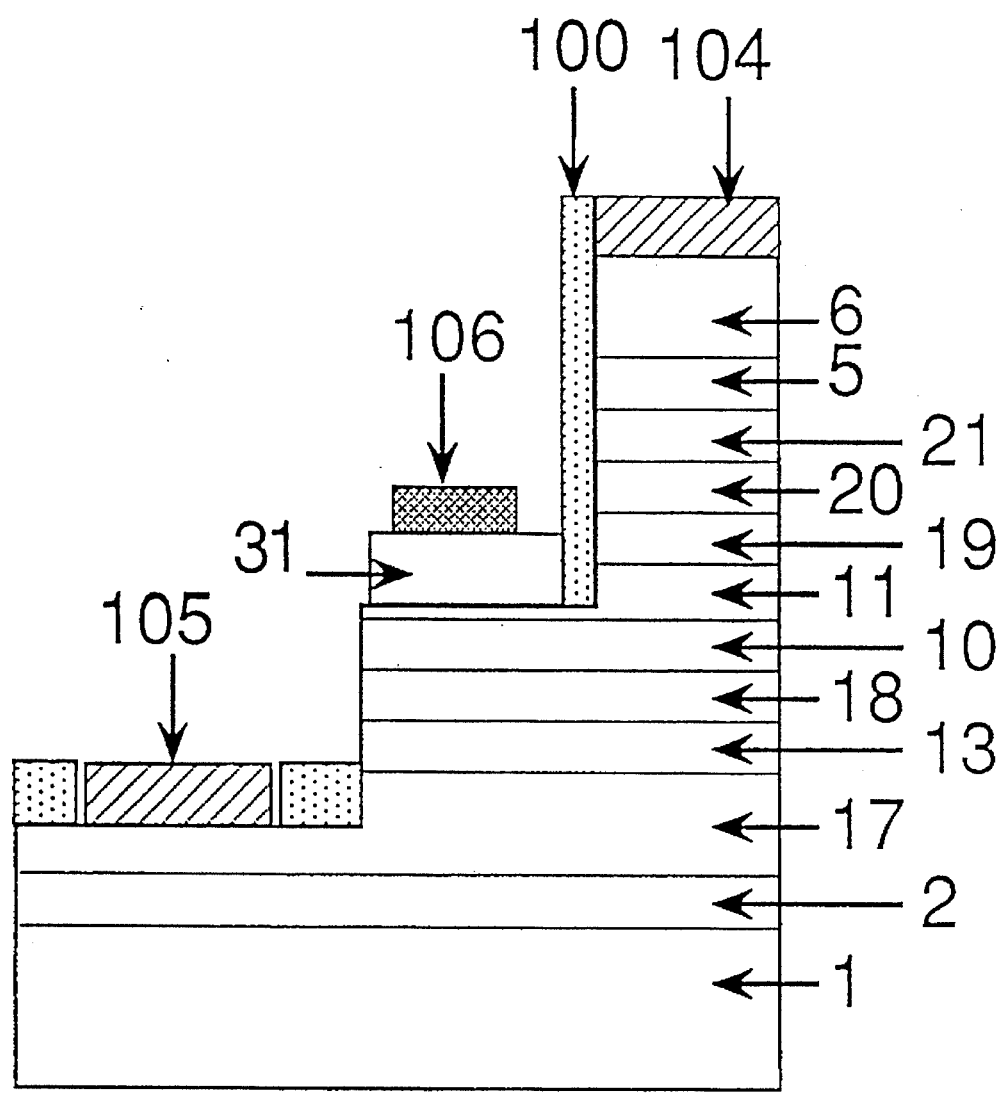
FIG. 23 is a sectional view a RHET according to the present invention.

FIG. 23 is a sectional view of a ninth example of the present invention. First, an undoped GaAs layer 2 (200 nm thick), a high-concentration n-GaAs (thickness: 500 nm, Si concentration: $5 \times 10^{18}/cm^3$) collector layer 17, a low-concentration n-GaAs (thickness: 400 nm, Si concentration: $5 \times 10^{16}/cm^3$) 13, a P-GaAs (thickness: 100 nm, Be concentration: $5 \times 10^{19}/cm^3$) base layer 18, an undoped GaAs spacer layer 10 (thickness: 3 nm), an n-AlGaAs layer 11 (Al composition: 0.3, thickness: 150 nm, Si concentration: $5 \times 10^{18}/cm^3$), an-undoped GlGaAs barrier layer 19 (Al composition: 0.45, thickness: 5 nm), an undoped GaAs quantum well layer 20 (thickness: 5 nm), an undoped AlGaAs barrier layer 21 (Al composition: 0.45, thickness: 5 nm) and an n-InGaAs layer 5 (In composition: 0.25, thickness: 10 nm, $3 \times 10^{18}/cm^3$) were successively grown by MBE on a semi-insulating GaAs substrate 1 in the above order, and lastly an n-GaAs cap layer 6 (Si concentration: $5 \times 10^{18}/cm^3$, thickness: 200 nm) was piled on top of the combination above.

Subsequently, element-to-element isolation was carried out by means of mesa etching and then an emitter electrode 104 and a collector electrode 105 were formed by lift-off. AuGe/Mo/Au was used as an emitter collector electrode material, which was evaporated before being alloyed (at 400° C. for 5 min) in an N2 atmosphere. A lift-off mask prepared by making an opening in an SiO2 film 100 through the ordinary photolithographic process was used. Moreover, the opening in the SiO2 film 100 was side-etched by wet etching so as to give it a form to be ready for lift-off. Further, a desired crystalline portion in the collector electrode region was removed by etching up to the mid-portion of the highly doped n-GaAs layer 17. Then a side wall of SiO2 film was formed around the emitter electrode and etching was applied so as to secure the base electrode region in self-alignment with the emitter electrode. At that time, the p-GaAs base layer 18 was removed up to this side thereof. The side wall of SiO2 film was further formed to secure the breakdown voltage between the intrinsic RHET region and a base electrode, and a p-GaAs layer 31 was also formed selectively by MOCVD. In addition, a base electrode 106 was formed by lift-off in part of the upper portion of the selective growth layer. Au/Mo/AuZn/Mo/Au was for use as the electrode material. In this manner, the RHET of FIG. 23 was prepared.

In the first, third, fifth, sixth, seventh, eighth and ninth examples, an AlGaAs layer may be held between the n-InGaAs layer 5 and the n-GaAs layer 6. If the AlGaAs layer is too thick, the resistance will increase. Favorable results were obtained when the thickness was not greater than 5 nm.

The conditions in the eighth and ninth examples may be altered as follows. Although the heterojunction was formed by MBE, a device capable of controlling the growth with an atomic layer as a unit, namely, MOCVD, MOMBE and the like may be employed. Se, S, C as well as Si and Be may be used as a dopant. Although GaAs was used for the selective growth layer 13, GaAsSb, InGaAs and the like which are low in resistance may also be used effectively when the In to Sb compositions and the impurity concentration varies in the selective growth layer or when the distribution of positive hole concentration increases in the vicinity of the base layer 18 or when that of effective positive hole mass decreases therein. The concentration and thickness of the n-InGaAs layer 5 are not restricted to those defined by way of example, but may be varied as in the case of the first example, whereas the concentration may be regulated as in the second example. Further, the performance was improved when use was made of an AlGaAs layer in which the Al composition ratio had been varied (low on the substrate side with Al composition: 0–0.1), in place of the p-GaAs base layer 18, and an AlGaAs with the Al composition: 0.1, in place of the undoped GaAs spacer layer 10. Although GaAs/AlGaAsHBT and RHET have been described in the examples above, the materials thus referred to are not limited to them, but also include strainable materials InGaAs/GaAs/AlGaAs, the InAlAs/InGaAs family, the InP/InGaP family and the Ge/SiGe family to obtain the same result. Moreover, p-n-p HBT and RHET instead of exemplified n-p-n HBT and RHET may be employed. In this case, similar effect is achievable by changing the dopant, though the Si, Be concentration and the thickness of n- and p-type layers are different.

EXAMPLES 10 TO 13

FIGS. 24 to 27 show examples of various circuits that can be formed using the semiconductor devices described herein. In FIGS. 24 to 27, the numerals are used to identify elements as follows: 200 is a first stage FET, 201 is a second stage FET, 202 is an input terminal, 203 is an output terminal, 204 is a gate bias supplying terminal of first stage FET, 205 is a gate bias supplying terminal of second stage FET, 206 is a drain bias supplying terminal of first stage FET, 207 is a drain bias supplying terminal of second stage FET, 208 is ground, 209 is a microstrip line, 210 is a capacitor, 211 is an inductor, 212 is a resistor, 213 is a local signal input terminal, 214 is an enhancement FET 1, 215 is an enhancement FET 2, 216 is an enhancement FET 3, 217 is a depletion FET, 218 is a power supply terminal, 219 is an input terminal 1, 220 is an input terminal 2, 221 is an input terminal 3, 222 is a driver FET 1, 223 is a driver FET 1, 224 is a cell load FET 1, 225 is a cell load FET 2, 226 is an access FET 1, 227 is an access FET 2, 228 is a bit line pull-up FET 1, 229 is a bit line pull-up FET 2, 230 is a voltage comparement terminal, 231 is a word line, and 232 is a bit line.

Figure 24:
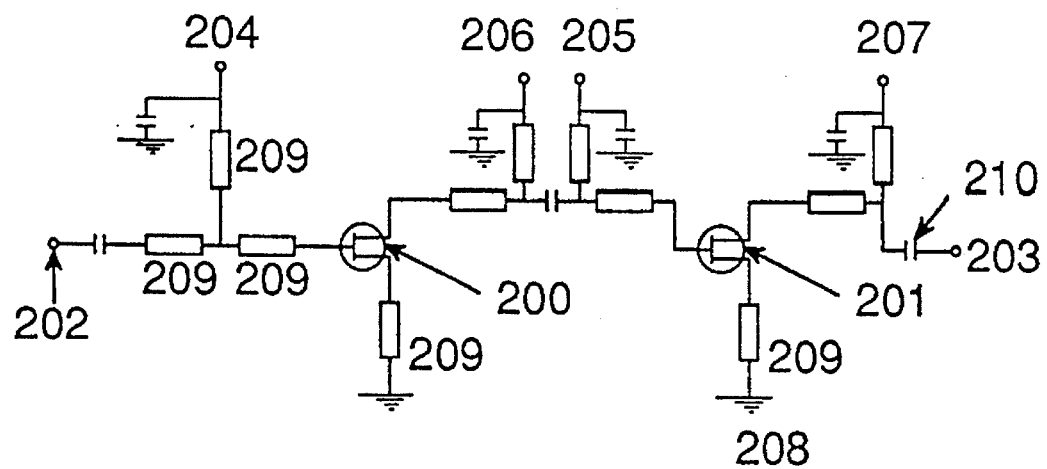
FIG. 24 is a circuit diagram of a low noise amplifier according the present invention.

Turning to the specific arrangements, FIG. 24 is a low noise amplifier circuit diagram as a tenth example of the present invention. In this example, perferably one of the FETs described in the third to sixth example is formed on a semiconductor substrate together with a matching circuit using a microstrip line 209 and a capacitor 210. Excellent performance of such a low-noise amplifier was obtained; namely, the minimum noise figure: 0.82 dB; and gain: 20.3 at 12 GHz under the conditions of the drain voltage and current of FET 200 at the initial stage: 2.5 V and 6 mA, and the drain voltage and current of FET 201 at the following stage: 2.5 V and 10 mA, respectively.

Although a second stage amplifier is shown by way of example herein, favorable results are obtainable even from a first stage amplifier. Favorable results were actually obtained from the matching circuit comprising a stripline or an inverse microstrip line, a spiral inductor and the like in place of the microstrip line and the capacitor. Although a so-called monolithic IC having a matching circuit and an active device mounted on the same substrate is shown in this example, a hybrid IC which is slightly inferior in performance but easy to manufacture, that is, which does not have the matching circuit and the active device mounted on the same substrate, is still usable to obtain favorable results. A low noise amplifier whose frequency range is in the 12 GHz band has been described. However, excellent characteristics in another frequency range were obtained by altering the matching circuit. Moreover, favorable operating voltage and current characteristics were also obtained in the fields of car telephones, mobile telephones and the like which require low power consumption in operation. In this case, the cell size necessary to obtain noise characteristics at the same performance level as what can be attained by using the conventional elements could be halved. This means a high-performance amplifier is available even if the circuit is formed with a few elements because the elements according to the present invention are superior in performance to conventional ones.

Figure 25:
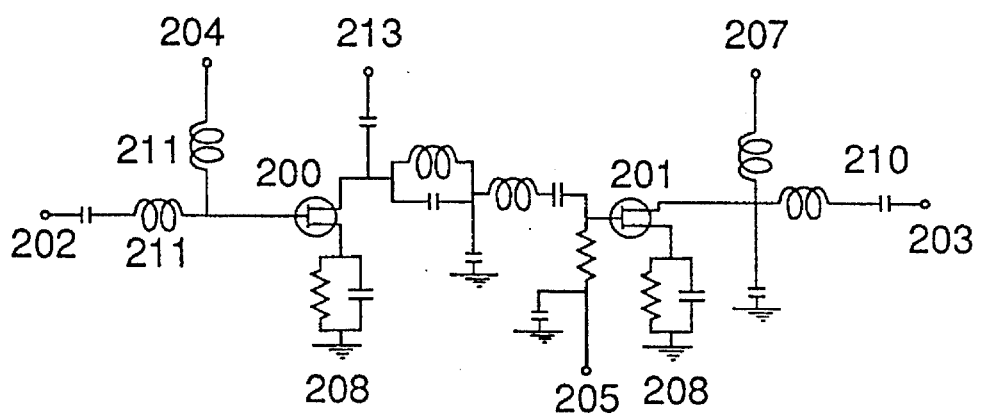
FIG. 25 is a circuit diagram of a mixer according to the present invention.

FIG. 25 is a mixer circuit diagram as an eleventh example of the present invention. In this example, preferably one of the FETs described in the third to sixth example is formed on a semiconductor substrate together with a matching circuit using a capacitor 210 and an inductor 211. Excellent performance of such a mixer was obtained; namely, conversion gain: 17.5 at 1.5 GHz at a local level 0.0 dBm under the conditions of the gate width and the drain current of FET 200 (mixer unit) at the initial stage: 600 μm and 0.5 mA respectively, and the drain current of FET 201 at the following stage: 2 mA.

Although a locally driven mixer is shown by way of example herein, favorable results are obtainable even when a double balanced or single balanced circuit configuration or a dual gate FET is employed. Although the clumped circuit element was used for the matching circuit, a distributed circuit element such as a microstrip line may be used to achieve favorable results. Although a so-called monolithic IC having a matching circuit and an active element mounted on the same substrate is shown in this example, a hybrid IC which is slightly inferior in performance but easy to manufacture, that is, which has the matching circuit and the active device not mounted on the same substrate, is still usable to obtain favorable results. The mixer whose frequency range is in the 1.5 GHz band has been described. However, excellent characteristics in another frequency range were obtained by altering the matching circuit.

Figure 26:
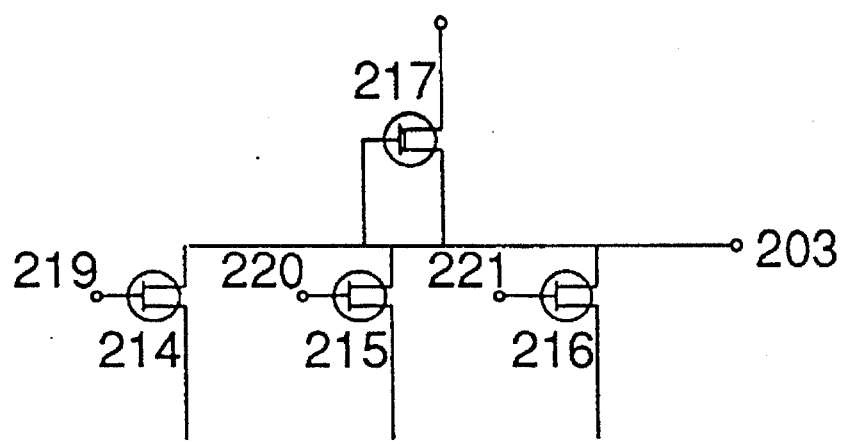
FIG. 26 is a 3-input NOR circuit diagram for a gate array according to the present invention.

FIG. 26 is a 3-input NOR circuit diagram as a twelfth example of the present invention, the circuit being the basic gate of a 4K gate array made by way of experiment. Preferably, one of the FETs described in the third to sixth example is formed on a semiconductor substrate for this example. The gate array employs enhancement FETs 213, 214, 215 with gate-widths being 20 μm, gate lengths of 0.3 μm and threshold voltages of 0.2 V, together with a depletion FET 216. Excellent performance of such a gate array has been obtained; namely, delay time: 82 ps; multiplication time at the longest digit in a 16×16 bit parallel multiplier as an evaluation circuit: 3.1 lns; and power consumption: 4.5 W under the conditions of the delay time of the gate: 30 ps; load (fan-in=fan-out=3); and wiring length: 1 mm.

Although a DCFL circuit with the 3-input NOR circuit as the basic gate is shown by way of example herein, favorable results are also obtainable from other circuit systems such as SCFL and complimentary circuits.

Figure 27:
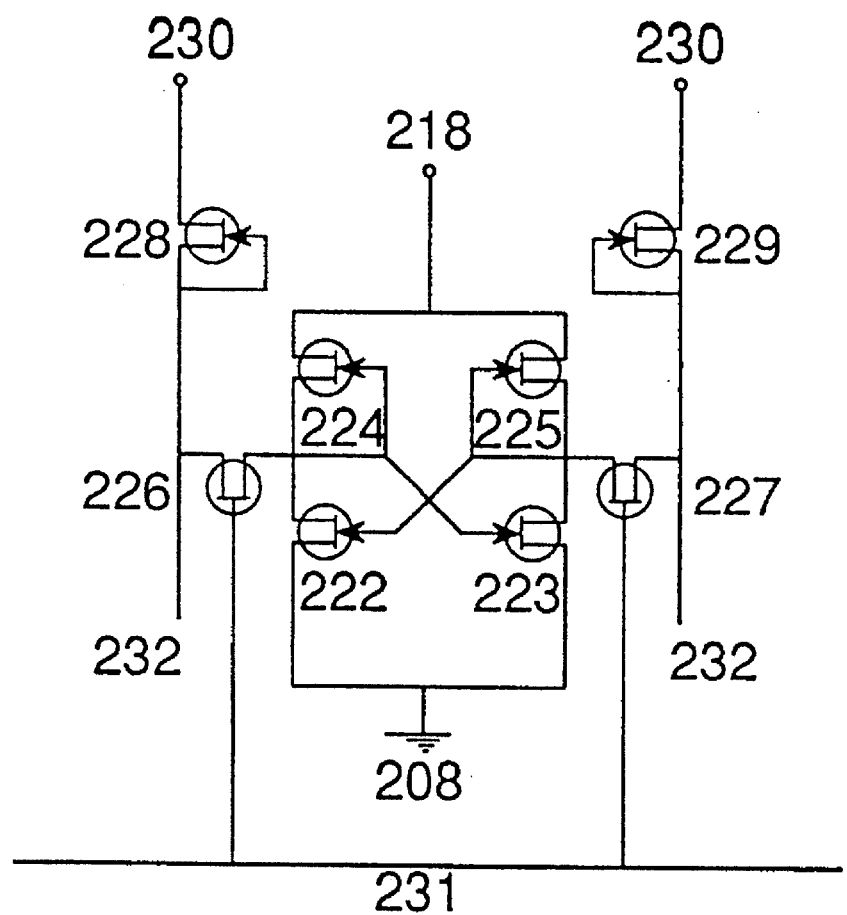
FIG. 27 is a memory cell circuit diagram for an SRAM according to the present invention.

FIG. 27 is a memory cell circuit diagram as a thirteenth example of the present invention. Preferably, one of the FETs described in the third to sixth example is formed on a semiconductor substrate for this embodiment. The memory cell employs enhancement FETs 217–222 with gate width being 20 μm, gate length 0.3 μm and threshold voltage 0.2 V in its flip-flop circuit. Excellent performance of such a memory has been obtained when 4KSRAM is formed; namely, access time: 0.25 ns; and power consumption: 4.1 W under the conditions of the ratio of the drain current of transistors 221, 222 to that of driver transistors 217, 218: 2:1; the ratio of the drain current of bit-line pull-up load transistors 223, 224 to that of the driver transistors: 2:1; and the ratio of the drain current of cell load transistors 219, 220 to that of the driver transistors: 1:10.

Although a flip-flop circuit SRAM using six transistors is shown by way of example herein, favorable results are also obtainable from other circuit systems such as DRAM and the like. This is also the case with a RAM having IIL and ECL circuit configurations using an HBT as in the eighth example.

Applications of low noise amplifiers, mixers, logic circuits and memories have been dealt with in the tenth to thirteenth examples. It is, however, apparent that excellent results are achievable by applying FETs and HBTs described in the third–eighth examples to circuits such as A/D and D/A converters, modulators, demodulators, oscillate circuits, multiplexers and demultiplexers.

According to the present invention as described above, resistance via tunneling can be lowered. By utilizing this phenomenon in the source region of an FET and the emitter and base regions of an HBT, high-performance elements become available. Moreover, the performance of low noise amplifiers, mixers, logic circuits, memories and the like using such elements is improved.

It is to be understood that the above-described arrangements are simply illustrative of the application of the principles of this invention. Numerous other arrangements may be readily devised by those skilled in the art which embody the principles of the invention and fall within its spirit and scope.

We claim:

1. A semiconductor device wherein a third semiconductor layer is located between a doped first semiconductor layer and a second semiconductor layer, said first semiconductor layer being in contact with said third semiconductor layer, wherein potential for a carrier flowing between the first and second semiconductor layers is greater at the third semiconductor layer than that at the first and second semiconductor layers, and wherein the semiconductor device is operated to provide tunneling of the carrier between the first and second semiconductor layers, characterized in that carrier density distribution in at least one direction of thickness of the first semiconductor layer is higher in the vicinity of the third semiconductor layer than in other areas up to a predetermined depth of said first semiconductor layer away from the third semiconductor layer.

2. A semiconductor device as claimed in claim 1, wherein said carrier density distribution in said first semiconductor layer continuously varies from the point of contact of said first and third semiconductor layers to said predetermined depth.

3. A semiconductor device as claimed in claim 1, wherein a combination of materials forming said first semiconductor layer and the third semiconductor layer is selected from the group consisting of GaAs and AlGaAs, InGaAs and AlGaAs, InGaAs and InAlAs, InGaAsSb and AlGaAsSb, InP and InGaP, and Ge and SiGe.

4. A semiconductor device as claimed in claim 3, wherein the material of said first semiconductor layer is InGaAs and also has an AlGaAs layer formed in contact with the InGaAs layer.

5. A semiconductor device as claimed in claim 4, wherein the AlGaAs layer is 5 nm thick or less.

6. A semiconductor device as claimed in claim 1, wherein the vicinity of the third semiconductor layer is 20 nm thick or less from the third semiconductor layer and the predetermined depth is 60 nm or less from the third semiconductor layer.

7. A semiconductor device as claimed in claim 1, wherein the semiconductor device is a heterojunction bipolar transistor in which the second semiconductor layer comprises the base region and the first and third semiconductor layers comprise the emitter region of the heterojunction bipolar transistor.

8. A semiconductor device as claimed in claim 1, wherein the semiconductor device comprises a field effect transistor and wherein the second semiconductor layer comprises the channel of the field effect transistor and the first and third semiconductor layers comprise contact areas between the source and drain electrodes of the field effect transistor and said channel.

9. A semiconductor device as claimed in claim 8, wherein the field effect transistor is structured so that the channel intentionally includes no impurities and that the channel is formed of carriers supplied from ionized impurities in a barrier layer.

10. A semiconductor device as claimed in claim 8, wherein the field effect transistor is structured so that the channel includes ionized impurities and that the barrier layer is provided to secure gate breakdown voltage.

11. A semiconductor device wherein a third semiconductor layer is located between a doped first semiconductor layer and a second semiconductor layer, said first semiconductor layer being in contact with said third semiconductor layer, wherein potential for a carrier flowing between the first and the second semiconductor layers is greater at the third semiconductor layer than that at the first and second semiconductor layers, and wherein the semiconductor device is operated to provide tunneling of the carrier between the first and second semiconductor layers, characterized in that effective mass distribution of carriers in at least one direction of thickness of the first semiconductor layer is smaller in the vicinity of the third semiconductor layer than in other areas of said first semiconductor layer.

12. A semiconductor device as claimed in claim 11, wherein the effective mass distribution of carriers continuously varies from the point of contact of the first and third semiconductor layers to a predetermined depth within said first semiconductor layer.

13. A semiconductor device as claimed in claim 11, wherein said first semiconductor layer comprises a laminate of two layers having different effective mass, and wherein the layer having the lower electron affinity of said two layers of said laminate is arranged on the third semiconductor layer side of said laminate.

14. A semiconductor device as claimed in claim 11, wherein a combination of materials forming said first semiconductor layer and the third semiconductor layer is selected from the group consisting of GaAs and AlGaAs, InGaAs and AlGaAs, InGaAs and InAlAs, InGaAsSb and AlGaAsSb, InP and InGaP, and Ge and SiGe.

15. A semiconductor device wherein a third semiconductor layer is located between a first semiconductor layer and a second semiconductor layer, wherein potential for a carrier flowing between the first and the second semiconductor layers is greater at the third semiconductor layer than that at the first and second semiconductor layers, and wherein the semiconductor device is operated to provide tunneling of the carrier between the first and second semiconductor layers, characterized in that the thickness of the third semiconductor layer is so arranged that an area of the third semiconductor layer in contact with the first semiconductor layer is substantially thinner in a direction going from the first semiconductor layer to the third semiconductor layer than the thickness of remaining area of the third semiconductor layer in said direction.

16. A semiconductor device as claimed in claim 15, wherein the first and third semiconductor layers comprise the contact area between the source and drain electrodes of a field effect transistor and a channel.

17. A semiconductor device as claimed in claim 15, wherein the third semiconductor layer is held between the first and second semiconductor layers and comprises a base electrode lead of a heterojunction bipolar transistor.

18. A semiconductor device as claimed in claim 17, wherein an area of the third semiconductor layer is held between the first and second semiconductor layers and forms an emitter electrode region of the heterojunction bipolar transistor.

19. A semiconductor device wherein a third semiconductor layer and a fourth semiconductor layer are held between a first semiconductor layer and a second semiconductor layer from the first semiconductor layer side, wherein potential for carriers flowing between the first and second semiconductor layers is greater at the third semiconductor layer than at the first, second and fourth semiconductor layers, wherein resistance for carriers flowing between the first and second semiconductor layers is greater at the fourth semiconductor layer than that at the first and second semiconductor layers, and wherein the semiconductor device is operated to provide tunneling of the carrier between the first and second semiconductor layers, characterized in that carrier density distribution in at least one direction of thickness of at least one of the first and second semiconductor layers is at its greatest value in the vicinity of the third semiconductor layer and is lower in areas away from the third semiconductor layer.

20. A semiconductor device as claimed in claim 19, wherein the third and fourth semiconductor layers are held between the first and second semiconductor layers to form a contact area between source and drain electrodes of a field effect transistor and a channel.

21. A semiconductor device wherein a third semiconductor layer and a fourth semiconductor layer are held between a first semiconductor layer and a second semiconductor layer from the first semiconductor layer side, wherein potential for carriers flowing between the first and second semiconductor layers is greater at the third semiconductor layer than that at the first, second and fourth semiconductor layers, wherein resistance for carriers flowing between the first and second semiconductor layers is greater at the fourth semiconductor layer than that at the first and second semiconductor layers, and wherein the semiconductor device is operated to provide tunneling of the carriers between the first and second semiconductor layers, characterized in that the device has an area in which effective mass distribution of carriers in at least one direction of thickness of the first and second semiconductor layers is at its smallest value in the vicinity of the third semiconductor layer and is increased in areas away from the third semiconductor layer.

22. A semiconductor device as claimed in claim 21, wherein the third and fourth semiconductor layers are held between the first and second semiconductor layers to form a contact area between source and drain electrodes of a field effect transistor and a channel.

23. A low noise amplifier comprised of a field effect transistor used as an active device wherein a third semiconductor layer is located between a doped first semiconductor layer and a second semiconductor layer, said first semiconductor layer being in contact with said third semiconductor layer, wherein potential for a carrier flowing between the first and second semiconductor layers is greater at the third semiconductor layer than that at the first and second semiconductor layers, and wherein the semiconductor device is operated to provide tunneling of the carrier between the first and second semiconductor layers, characterized in that carrier density distribution in at least one direction of thickness of the first semiconductor layer is higher in the vicinity of the third semiconductor layer than in other areas up to a predetermined depth of said first semiconductor layer away from the third semiconductor layer; and wherein the second semiconductor layer comprises the channel of the field effect transistor and the first and third semiconductor layers comprise contact areas between the source and drain electrodes of the field effect transistor and said channel.

24. A mixer comprised of a field effect transistor used as an active device wherein a third semiconductor layer is located between a doped first semiconductor layer and a second semiconductor layer, said first semiconductor layer being in contact with said third semiconductor layer, wherein potential for a carrier flowing between the first and second semiconductor layers is greater at the third semiconductor layer than that at the first and second semiconductor layers, and wherein the semiconductor device is operated to provide tunneling of the carrier between the first and second semiconductor layers, characterized in that carrier density distribution in at least one direction of thickness of the first semiconductor layer is higher in the vicinity of the third semiconductor layer than in other areas up to a predetermined depth of said first semiconductor layer away from the third semiconductor layer; and wherein the second semiconductor layer comprises the channel of the field effect transistor and the first and third semiconductor layers comprise contact areas between the source and drain electrodes of the field effect transistor and said channel.

25. A logic circuit comprised of a field effect transistor used as an active device wherein a third semiconductor layer is located between a doped first semiconductor layer and a second semiconductor layer, said first semiconductor layer being in contact with said third semiconductor layer, wherein potential for a carrier flowing between the first and second semiconductor layers is greater at the third semiconductor layer than that at the first and second semiconductor layers, and wherein the semiconductor device is operated to provide tunneling of the carrier between the first and second semiconductor layers, characterized in that carrier density distribution in at least one direction of thickness of the first semiconductor layer is higher in the vicinity of the third semiconductor layer than in other areas up to a predetermined depth of said first semiconductor layer away from the third semiconductor layer; and wherein the second semiconductor layer comprises the channel of the field effect transistor and the first and third semiconductor layers comprise contact areas between the source and drain electrodes of the field effect transistor and said channel.

26. A memory cell comprised of a field effect transistor used as an active device wherein a third semiconductor layer is located between a doped first semiconductor layer and a second semiconductor layer, said first semiconductor layer being in contact with said third semiconductor layer, wherein potential for a carrier flowing between the first and second semiconductor layers is greater at the third semiconductor layer than that at the first and second semiconductor layers, and wherein the semiconductor device is operated to provide tunneling of the carrier between the first and second semiconductor layers, characterized in that carrier density distribution in at least one direction of thickness of the first semiconductor layer is higher in the vicinity of the third semiconductor layer than in other areas up to a predetermined depth of said first semiconductor layer away from the third semiconductor layer; and wherein the second semiconductor layer comprises the channel of the field effect transistor and the first and third semiconductor layers comprise contact areas between the source and drain electrodes of the field effect transistor and said channel.

27. A semiconductor device wherein a third semiconductor layer is located between a doped first semiconductor layer and a second semiconductor layer, said first semiconductor layer being in contact with said third semiconductor layer, wherein potential for a carrier flowing between the first and second semiconductor layers is greater at the third semiconductor layer than that at the first and second semiconductor layers, and wherein the semiconductor device is operated to provide tunneling of the carrier between the first and second semiconductor layers, characterized in that an ionized impurity concentration in at least one direction of thickness of the first semiconductor layer is higher in the vicinity of the third semiconductor layer than in other areas up to a predetermined depth of said first semiconductor layer away from the third semiconductor layer.

28. A semiconductor device as claimed in claim 14, wherein the material of said first semiconductor layer is InGaAs and also has an AlGaAs layer formed in contact with the InGaAs layer.

29. A semiconductor device as claimed in claim 28, wherein the AlGaAs layer is 5 nm thick or less.

30. A semiconductor device as claimed in claim 27, wherein the ionized impurity concentration in said first semiconductor layers continuously decreases from the point of contact with the third semiconductor layer to the predetermined depth.

31. A semiconductor device as claimed in claim 27, wherein the carriers are electrons, wherein said first semiconductor layer comprises a laminate of two layers having different electron affinities, and wherein the layer of the laminate having the greater electron affinity is arranged on the third semiconductor layer side of said laminate.

32. A semiconductor device as claimed in claim 27, wherein the carriers are positive holes, wherein the first semiconductor layer comprises a laminate of two layers having different sums of electron affinity and a band gap, and wherein the layer having the smaller sum of electron affinity and the band gap is arranged on the third semiconductor layer side of said laminate.

33. A semiconductor device as claimed in claim 31, wherein said first semiconductor layer comprises a laminate of two layers formed of one and the same material selected from the group consisting of InGaAs, InGaAsSb, GaAsSb, InGaP, SiGe, and wherein the layer arranged on the third semiconductor layer side of said laminate has a greater composition of In, Sb or Ge.

34. A semiconductor device as claimed in claim 33, wherein the thickness of the layer arranged on the third semiconductor layer side of said laminate and the In, Sb, Ge compositions are so controlled as to prevent dislocation from being admitted into a crystal.

* * * * *